United States Patent
Pratt et al.

(10) Patent No.: US 9,641,206 B2
(45) Date of Patent: May 2, 2017

(54) HIGHLY INTEGRATED RADIO FREQUENCY TRANSCEIVER

(71) Applicant: ANALOG DEVICES GLOBAL, Hamilton (BM)

(72) Inventors: Patrick Pratt, Mallow (IE); Martin Steven McCormick, Cambridge, MA (US)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 14/973,725

(22) Filed: Dec. 18, 2015

(65) Prior Publication Data

US 2016/0204809 A1   Jul. 14, 2016

Related U.S. Application Data

(60) Provisional application No. 62/103,395, filed on Jan. 14, 2015.

(51) Int. Cl.
| | |
|---|---|
| *H04B 1/40* | (2015.01) |
| *H04B 1/04* | (2006.01) |
| *H04B 7/0452* | (2017.01) |
| *H04L 27/26* | (2006.01) |

(Continued)

(52) U.S. Cl.
CPC ............ *H04B 1/0475* (2013.01); *H04B 1/04* (2013.01); *H04B 1/40* (2013.01); *H04B 1/525* (2013.01); *H04B 7/0452* (2013.01); *H04L 27/2614* (2013.01); *H04W 88/08* (2013.01); *H04B 2001/0425* (2013.01); *H04B 2001/0433* (2013.01); *H04B 2001/0441* (2013.01)

(58) Field of Classification Search
USPC ......................... 375/219, 297; 455/12.1, 341
See application file for complete search history.

(56) References Cited

U.S. PATENT DOCUMENTS

| | | | | |
|---|---|---|---|---|
| 8,170,507 B2 * | 5/2012 | Wang | .................... | H03F 1/3241 375/297 |
| 8,576,944 B2 * | 11/2013 | Chen | .................. | H04L 27/2614 327/291 |
| 2002/0101937 A1 | 8/2002 | Antonio et al. | | |

(Continued)

OTHER PUBLICATIONS

European Search Report issued in EP Patent Application Serial No. 16150331.3 mailed Jun. 13, 2016, 10 pages.

(Continued)

*Primary Examiner* — Eva Puente
(74) *Attorney, Agent, or Firm* — Patent Capital Group

(57) ABSTRACT

For small cells, transceivers demand high performance while maintaining system efficiency. The present disclosure describes a highly integrated cellular transceiver that offers such features by providing one or more digital functions on-chip, onto the same die in the cellular transceiver. Effectively, the scope and boundary of the cellular transceiver is expanded to move beyond the data converters of the transceiver to include a variety of digital functions, thus integrating more of the signal chain in the cellular transceiver. Integration can greatly reduce complexity for the baseband processing, lower the cost of the overall transceiver system, reduce power consumption, and at the same time, benefit from improvements on the digital functions through integration.

24 Claims, 12 Drawing Sheets

(51) Int. Cl.
*H04W 88/08* (2009.01)
*H04B 1/525* (2015.01)

(56) References Cited

U.S. PATENT DOCUMENTS

| | | | |
|---|---|---|---|
| 2003/0207680 A1* | 11/2003 | Yang | H03F 1/3247 |
| | | | 455/341 |
| 2009/0051426 A1 | 2/2009 | Ba et al. | |
| 2013/0166259 A1 | 6/2013 | Weber | |
| 2014/0269852 A1 | 9/2014 | Pratt | |
| 2014/0292403 A1* | 10/2014 | Liu | H03F 1/3241 |
| | | | 330/149 |
| 2014/0362949 A1 | 12/2014 | Pratt | |
| 2015/0061769 A1 | 3/2015 | Bodnar | |
| 2015/0288399 A1 | 10/2015 | Pratt | |
| 2015/0289154 A1 | 10/2015 | Pratt | |
| 2016/0126903 A1* | 5/2016 | Abdelrahman | H04B 1/0475 |
| | | | 330/149 |
| 2016/0191146 A1* | 6/2016 | Abouelenin | H04B 7/18513 |
| | | | 455/12.1 |
| 2016/0277046 A1 | 9/2016 | Pratt et al. | |

OTHER PUBLICATIONS

P. Pratt et al., *Digitally Assisted RF Filter [Self Interference Cancellation System]*, published in Microwave Conference (EuMC), 2014 44th European, Oct. 6-9, 2014, 4 pages.

* cited by examiner

HIGHLY INTEGRATED RADIO FREQUENCY TRANSCEIVER

CROSS-REFERENCE TO RELATED APPLICATIONS

This application claims the benefit of and priority from U.S. Provisional Patent Application Ser. No. 62/103,395 filed 14 Jan. 2015 entitled "HIGHLY INTEGRATED RADIO FREQUENCY TRANSCEIVER," which is incorporated herein by reference in its entirety.

TECHNICAL FIELD OF THE DISCLOSURE

The present invention relates to the field of integrated circuits, in particular to highly integrated radio frequency transceivers.

BACKGROUND

Radio frequency transceivers include both a transmitter and a receiver in a single package. Transceivers are used in mobile cell towers of cellular wireless telecommunications networks, which are provided to facilitate radio access and wireless communication between user equipment and a network. Such mobile cell towers are commonly referred to by different terms which depend on the type of a radio access technology used to implement the radio access functionality of the tower and a part of the telecommunications network that utilizes the tower. When implemented in 2G or 2.5G telecommunications networks such as e.g. GSM, mobile cell towers are typically referred to as Base Transceiver Stations (BTS's). When implemented in 3G telecommunications networks such as e.g. UMTS, mobile cell towers are typically referred to as NodeBs (sometimes abbreviated as NBs). When implemented in 4G telecommunications networks such as e.g. Long Term Evolution (LTE), mobile cell towers are typically referred to as eNodeBs (sometimes abbreviated as eNBs). In the following, the term "base station" is used as a common term to describe a mobile cell tower independent of any specific type of a telecommunications network, i.e. to describe a radio access point that supports radio access between user equipment and the core of a telecommunications network. User equipment includes mobile phones, tablets, and devices with wireless connectivity, etc. Large base stations (or macrocells) can have a range of tens of kilometers, and can support many users at a time. Transceivers in macrocells are usually designed for high performance, without much concern for cost or power efficiency. Transceivers with small form factor are used in mobile handsets to provide wireless communications between mobile handsets and mobile cell towers. Transceivers in handsets are usually designed with reasonable or mediocre performance at low cost while consuming small amounts of power.

Besides being used in macrocells, transceivers are also used in small cell base stations (where, again, depending on the network, terms other than "base station" may be used—e.g. Home eNodeB, abbreviated as HeNB, is used in LTE networks, but "base station" as defined herein is intended to cover those network nodes as well), which are, essentially, full featured radio access points as macrocells, but configured to provide proximate coverage in a smaller area, e.g. in business or residential environments, than macrocells. Typically small cell radio access points operate at lower power levels than macrocells and serve as low-powered radio access nodes with ranges between 10 meters to 1 or 2 kilometers. Small cells can include femtocells, picocells, and microcells. These small cells are sometimes used to offload data traffic to enable a more efficient use of radio spectrum. For instance, a small cell provides high-quality cellular phone reception within a home, allowing everyone in the home unlimited voice and data usage. The small cell overcomes the limitation of 3G signals from the base station to penetrate walls, and enables high-speed access to mobile data services such as browsing the Internet, downloading music, and streaming video. With its tremendous advantages, millions or perhaps billions of small cells have been or will be deployed.

OVERVIEW

For small cells, transceivers demand a high system efficiency due to limited power and cooling budgets while maintaining good performance. In addition, growing Massive Multiple Input Multiple Output (MIMO) base station arrays may have many transceiver elements that consume a larger portion of the overall base station power. In such settings, each transceiver element should be reduced in power in order for Massive MIMO to be viable for broad deployment. The present disclosure describes a highly integrated cellular transceiver that offers greater efficiency by providing one or more digital functions on-chip, onto the same die in the cellular transceiver. Effectively, the scope and boundary of the cellular transceiver is expanded to move beyond the data converters of the transceiver to include a variety of specially implemented digital functions, thus integrating more of the signal chain in the cellular transceiver. Integration can greatly reduce complexity for the baseband processing, lower the cost of the overall transceiver system, reduce power consumption and interfacing bandwidth, and at the same time, can benefit from improvements on the digital functions themselves through integration.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1:
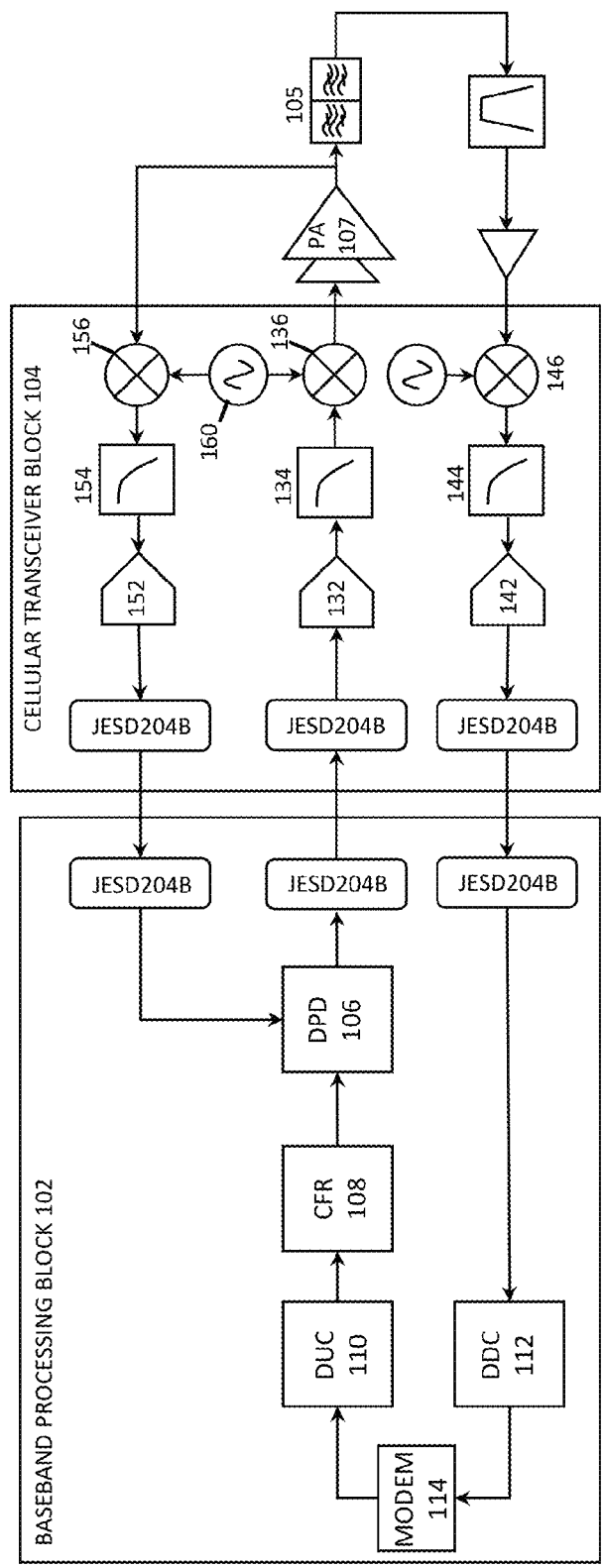
FIG. 1 illustrates an exemplary architecture for a transceiver system.

DESCRIPTION OF EXAMPLE EMBODIMENTS
OF THE DISCLOSURE

Unique Challenges and Solutions in Radio Design for Small Cells

Small cells, which must provide the quality of service (QoS) expected from a base station at a cost similar to a handset, present unique challenges to the radio designer. In particular, small cells preferably provide both high-quality voice service and high-speed mobile data services at a fraction of the cost and physical size of a macrocell. Cost of a small cell can be affected by the number of components or parts of the small cell. If the number of discrete parts can be reduced, the costs for sourcing the parts can be lowered. To further lower costs, small cells preferably has integrated circuits that minimize configuration, calibration, and testing. Physical size can be reduced by decreasing complexity of parts and removing bulky components. Even though small cells generally transmit at low power (when compared to macrocells), power efficiency remains a concern.

Traditionally, transceivers for mobile handsets have been designed to reduce cost (for high volume production) and physical size. However, the design problem of designing cheaper and smaller transceivers for handsets is wholly different for small cells. In one example, power reduction techniques and/or other digital functions are often not provided with transceivers of handsets because the net power reduction is too small to make power reduction techniques worthwhile (or positive net power reduction is simply not possible to achieve). However, transceivers in small cells (which generally consume relatively more power than transceivers in handsets) can greatly benefit from sizable net power reduction offered by the power reduction techniques. In another example, while highly integrated transceivers makes sense from a production point of view for handsets, and the highly integrated transceivers for handsets are designed to usually meet far more relaxed requirements than requirements of transceivers in small cells. Radio specifications for small cells are much more difficult than specifications for handsets; small cell manufacturers may often elect to pay for discrete components to get the best performance.

For small cells, integrating power reduction techniques and/or other digital functions can greatly lower cost while offering high performance. Costs are reduced when manufacturers no longer have to purchase many discrete components. Physical size can be reduced if integrated digital functions can replace otherwise bulky discrete components, if the digital functions can compensate for the functions previously provided by those bulky discrete components. When manufacturers are producing hundreds of small cells in a metropolitan areas, or when service provides are replacing large macrocells with many small cells (thousands of small antennas each supplied with a transceiver), the large volume and high quality can greatly benefit from a highly integrated cellular transceiver solution at a low cost yet with high performance. There are many non-trivial technical challenges and considerations when designing a highly integrated cellular transceiver for small cells. With the proper design, the resulting highly integrated cellular solution can offer high performance at a low cost.

Understanding Transceiver Systems with Heavy Duty Baseband Processing

FIG. 1 illustrates an exemplary architecture for a transceiver system. In this example, a transceiver system (e.g., a radio) includes a baseband processing 102 and a cellular transceiver 104, both provided as separate chips or distinct physical units. For instance, a small cell provider may purchase a cellular transceiver 104 from one company, and the small cell provider would design a specialized processor to serve as the baseband processing 102 to complement the cellular transceiver 104. The cellular transceiver 104 has a transmit path for transmitting a transmit signal. A transmit path can be represented by at least, e.g., a digital-to-analog converter (DAC) 132, a filter 134, a mixer 136. The transmit signal may be amplified by a power amplifier (PA) 107 prior to transmission over an antenna. More transmit paths can be provided for more transmit channels/bands, depending on the application. The cellular transceiver 104 has a receive path for receiving a receive signal. A receive path can be represented by at least, e.g., a mixer 146, a filter 144, and an analog-to-digital (ADC) converter 142. More receive paths can be provided for more receive channels/bands, depending on the application. In this example, the transceiver system is a half duplex system, where only one path can transmit or receive at a time (and not transmit and receive simultaneously). The transceiver system can include a duplexer 105 which can serve to isolate the transmit path and the receive path while permitting both to share a common antenna. In some embodiments, the transceiver system is a full duplex system (without a duplexer), where two or more paths can transmit and receive at the same time.

The baseband processing 102, having various radio frequency (RF) functions, is typically implemented on a Field Programmable Gate Array (FPGA) or an Application Specific Integrated Circuit (ASIC). The baseband processing 102 can include heavy duty or highly intensive digital functions, which processes a digital signal prior to providing the digital signal to the cellular transceiver 104. For instance, the baseband processing 104 includes digital pre-distortion (DPD) 106 to predistort or adjust the digital signal to improve the linearity of the power amplifier (PA) 107. The baseband processing 102 can include crest factor reduction (CFR) 108 for limiting the dynamic range of the transmit signal. The baseband processing 102 can include digital up conversion (DUC) 110 for up converting the sample rate of a digital signal of the transmit path from the modem 114 (e.g., from baseband to some intermediate frequency). The baseband processing 102 can include digital down conversion (DDC) 112 for down converting the sample rate of a digital signal of the receive path from the cellular transceiver 104 (e.g., from some intermediate frequency to baseband).

To provide (closed-loop) digital pre-distortion, the cellular transceiver 104 can include an observation receive (ORX) path for observing the output of the PA 107 and providing a feedback signal to the DPD 206. In some cases, the ORX path can be provided externally by some other component. The ORX path can be represented by at least, e.g., a mixer 156, a filter 154, and an analog-to-digital converter 152, where the mixer 156 may share a common local oscillator (LO) 160 with the mixer 136 of the transmit path.

As described above, the baseband processing 102 is usually a highly intensive digital block that interfaces the cellular transceiver to form a transceiver system, such as a radio for a small cell. The interface, in this example, between a data converter (e.g., 152, 132, 142) and the baseband processing 102, is typically a high speed serial data interface, such as the JESD204b converter interfaces as shown. The interfaces allows digital data to be transmitted over many lanes at very high number of bits per second (bps) (e.g., hundreds of megabits per second to tens of gigabits per second) with only a few pin.

The exemplary architecture shown in FIG. 1 can deliver the performance that is required by small cells, but has several shortcomings. One downside is that the baseband processing 102 is complex, and may require one or more discrete parts, which can increase costs. Another downside is that the high speed serial interfaces (requiring actual hardware to provide the data interfaces) can consume a lot of power. Power efficiency is a big issue for small cells or low power base stations, and the power consumed at the interface can be a dominant contributor.

Highly Integrated Cellular Transceiver with Integrated Digital Pre-Distortion (and Crest Factor Reduction)

Instead of providing the digital functions in the baseband processing, the highly integrated cellular transceiver addresses some of the above mentioned shortcomings by providing one or more digital functions on-chip, onto the same die, in the cellular transceiver. Effectively, the scope and boundary of the cellular transceiver is expanded to move beyond the data converters, thus integrating more of the signal chain and digital functions on-chip onto the same die of the cellular transceiver. The disclosure describes the various digital functions in detail; it is understood by one skilled in the art that any suitable and workable combination of the digital functions can be integrated onto the same die of the cellular transceiver.

Figure 2A:
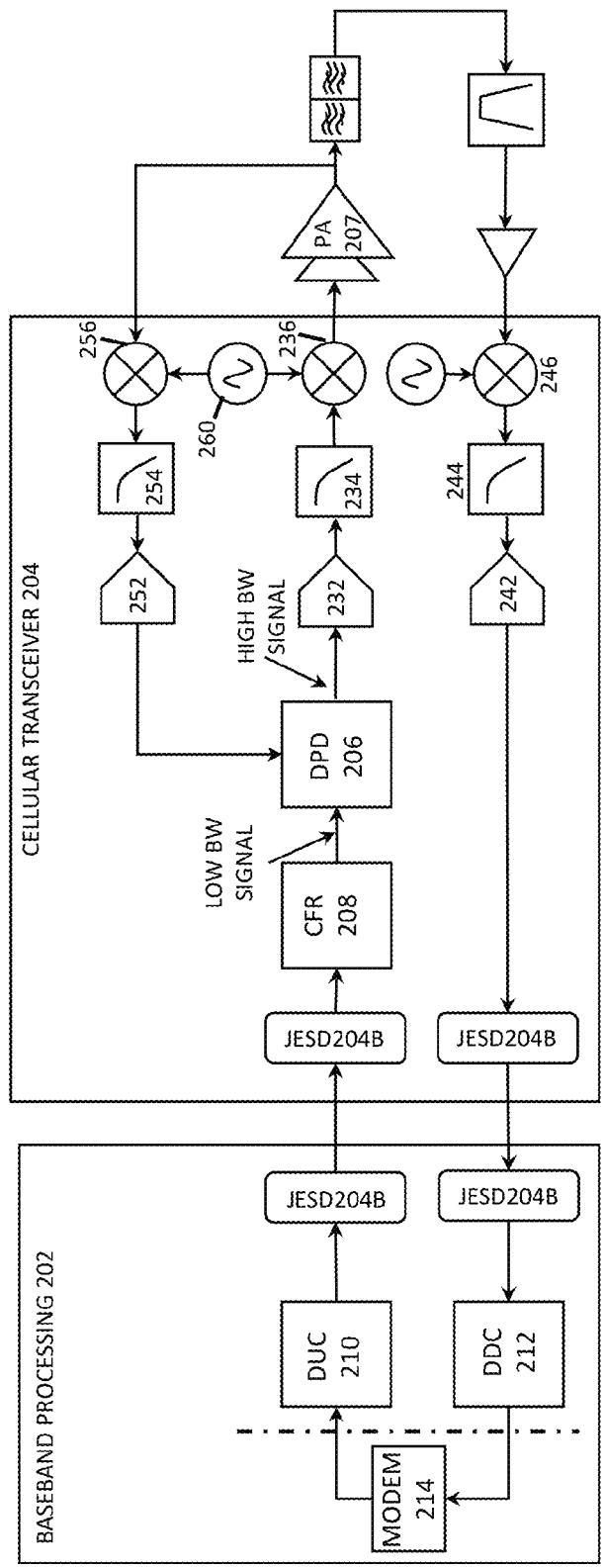
FIG. 2A illustrates an exemplary transceiver system including a highly integrated cellular transceiver having digital functions integrated on-chip, according to some embodiments of the disclosure.

FIG. 2A illustrates an exemplary transceiver system including a highly integrated cellular transceiver having digital functions integrated on-chip, according to some embodiments of the disclosure. The transceiver system has baseband processing 202 and cellular transceiver 204. In this example, the highly integrated cellular transceiver 204 have some digital functions on-chip. The transceiver 204 includes a transmit path for transmitting a transmit signal, where the transmit path can be represented by at least, e.g., a DAC 232, a filter 234, and mixer 236. The transceiver 204 also includes a receive path for receiving a receive signal, where the receive path can be represented by at least, e.g., a mixer 246, a filter 244, and an ADC 242. In contrast to the architecture shown in FIG. 1, the transceiver system of FIG. 2A includes a digital pre-distortion (DPD) module 206 for improving the linearity of the transmit path and/or a power amplifier 207 for the transmit path. In particular, the transmit path, the receive path, and the DPD module 206 are provided onto a single die.

The DPD module 206 provides, as a result of its processing, a signal for transmission that is improved in terms of compensating for the nonlinearity of the transmit path and/or the power amplifier 207. Thus, following the digital processing of the DPD module 206, the DAC 232 of the transmit path is configured to convert the output of the DPD module from digital to analog domain, then the filter 234 is configured to filter the analog transmit signal to eliminate DAC sampling harmonic artifacts (images) and the mixer 236 is configured to modulate the signal to an intermediate frequency (IF) or RF carrier frequency based on a local oscillator 260.

The mixer 246 of the receive path is configured to mix the received signal from an IF or RF carrier to baseband. The filter 244 of the receive path is configured to remove out-of-band components. The ADC 242 of the receive path is configured to convert the filtered signal from the analog to digital domain for further processing in the digital domain, e.g. by the TX component cancellation module 308 described below.

Integrating DPD module 206 within the cellular transceiver 204 can reduce the cost of having a discrete block for providing DPD, and perhaps more importantly, integrating DPD module 206 can reduce power consumption. Typically, the DPD module 206 is non-linear, and the signal bandwidth at the output of the DPD is generally significantly wider (e.g., 5×) than the signal bandwidth at the input of the DPD. Normally, wider bandwidth means higher amount of data traffic, wider serial link, and faster the interface has to be clocked. As seen in FIG. 2A, the chip boundary, i.e., the boundary between the high speed serial data interfaces, has a lower bandwidth than before (e.g., when compared against FIG. 1). Assuming power consumption is linear (or square) of the clock, an interface being at the output of the DPD module 206 can consume at least 5× more power than an interface being at the input of the DPD module 206 (or at any point further back of the signal chain, closer to baseband). Not to mention, when the bandwidth is lower, the number of lanes needed for the high speed serial data interface can also be reduced.

Note that when the DPD module 206 is integrated onto a single die so that the DPD module 206 is physically collocated with and adjacent to the data converter (e.g., 232), a high speed serial data interface (e.g., JESD204b) is not needed at all. Instead, the connection between the DPD module 206 and the DAC 232 can be provided by laying down copper tracks between the DPD module 206's output buffer and the DAC 232's input buffer (thereby obviating the serial data interface between DPD module 206 and DAC 232).

Integrating DPD onto the same die with the transceiver is not trivial, especially if the resulting transceiver 204 is to maintain low power consumption and small physical size. To make an efficient transceiver, the DPD module 206 preferably has a small footprint and consumes little power. To achieve a small footprint, the DPD module 206 can employ various techniques to reduce the complexity of the DPD module 206 while providing reasonable performance. The techniques may include companding, coarse quantization, combined look-up table, sparse sample correlation.

Figure 2B:
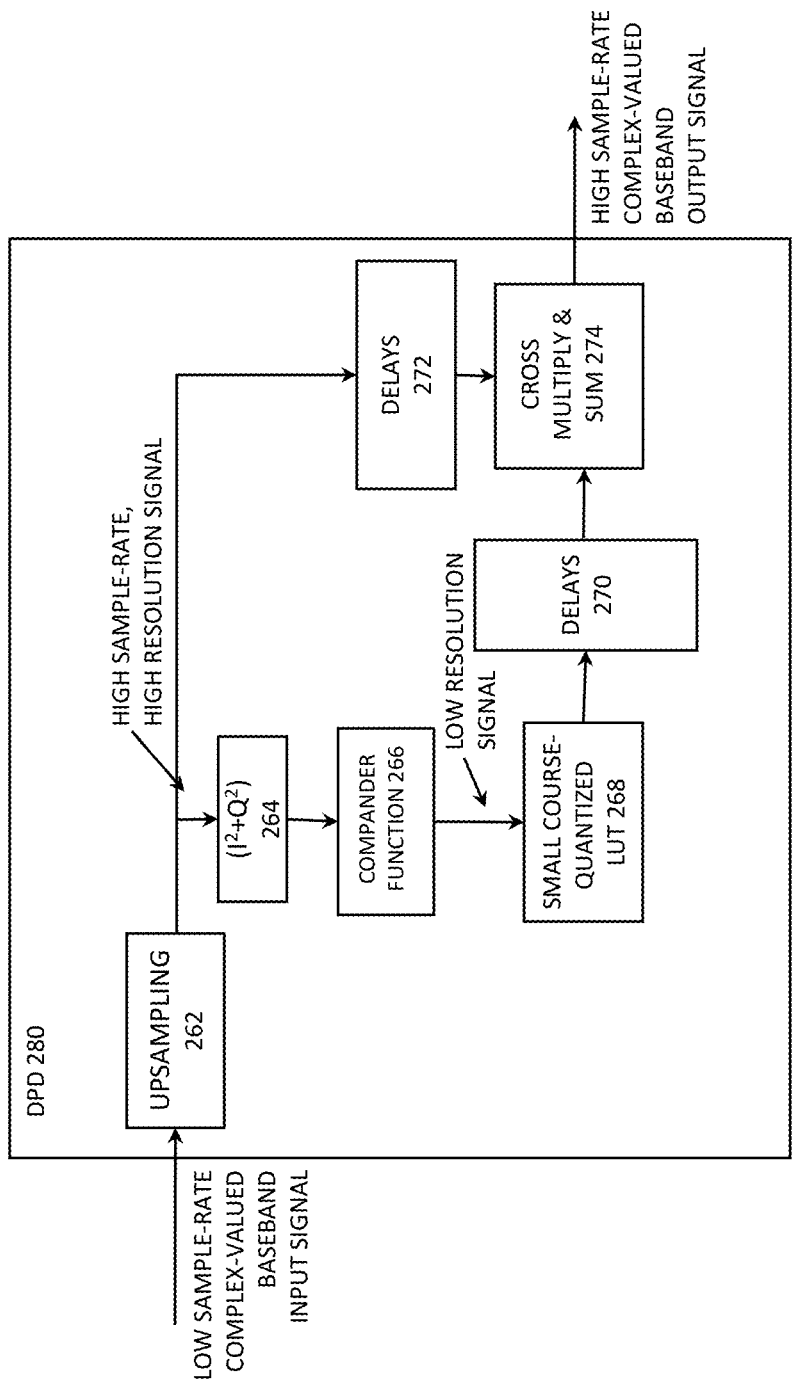
FIG. 2B illustrates an extended view of an exemplary implementation of a DPD module, according to some embodiments of the disclosure.

FIG. 2B illustrates an extended view of an exemplary implementation of a DPD module 280, which could be implemented e.g. as the DPD module 206, according to some embodiments of the disclosure. As shown in FIG. 2B, a high resolution, low sample-rate signal received at the DPD module 280 is first up-sampled by an up-sampling module 262 to produce a high sample-rate signal that can represent non-linear products in the DPD model without spectral aliasing from violating the Nyquist Rate. In order for the DPD to perform well and cancel non-linear distortion products for a wide bandwidth, a DPD module needs to operate on high sample rate input signals. Including the up-sampling module 262 within the DPD module, or at least on the same semiconductor die as the DPD module, advantageously decreases requirements of the interface to the DPD module because it only needs to support low sample-rate input signals, while allowing to take full advantages of DPD by still being able to apply all DPD operations to high sample-rate signals.

Following the up-sampling, the high sample rate signal is provided to a magnitude-squared 264 configured to compute a magnitude-squared of the received high-resolution complex-valued input signal as $I^2+Q^2$, where I is the real part of the complex-valued baseband input signal and Q is the imaginary part of the complex-valued baseband input signal. A compander function 266, such as e.g. mu-law (μ-law) function, may be inserted directly after the magnitude-squared 264 and is configured to reduce the number of bits used for the index when addressing a look up table (LUT) 268 of the DPD module 280. Such reduction allows for a more efficient use of the dynamic range of a LUT, and therefore, allows to use a much smaller LUT as the LUT 268. A smaller LUT results in smaller die area needed to implement the LUT. In some implementations, reducing the number of entries in the LUT 268 by 16 times may be possible, resulting in 16 times lesser area for the LUT 268 which allows integration of the DPD module 280 in the transceiver 204.

In various embodiments, the LUT 268 may be configured so that the entries of the LUT 268 are warped or re-indexed to undo the effect of the compander function 266 and, also, to apply a desired square-root function needed to compute magnitude of complex-valued baseband input signal from $I^2+Q^2$ block 264. This eliminates the need to otherwise compute the magnitude as sqrt($I^2+Q^2$) with a costly square-root or iterative CORDIC function and lowers power and area usage.

In some embodiments, the LUT 268 may be a combined LUT that combines multiple look up tables into a single, wider output, look up table in order to further reduce footprint.

Further implementing coarse quantization of the LUT output in a DPD module, e.g. of the output of the LUT 268, to a smaller number of bit than the output would have been otherwise, e.g. to 10 bits, would further reduce the number of bits stored in the LUT and, hence, the implementation area.

Various delay blocks 270, 272 can perform zero or more sample delays of the LUT output for representing memory effects in the digital-predistortion model. Memory delays may be based on memory polynomial models, generalized memory polynomials, Wiener-Hammerstein models, or other DPD models known in the art.

Multiplication of the delayed LUT values with the original complex-valued baseband signal can be performed and the results summed over different delays according to the DPD model being employed (block 274). The sum result gives the complex-valued baseband DPD output signal.

The transceiver 204 can further include an observation receive (ORX) path for observing the output of the power amplifier 207 and providing a feedback signal to the DPD module 206. The ORX path can be represented by at least, e.g., a mixer 256, a filter 254, and an ADC 252 (where the mixer 256 can share local oscillator (LO) 260 with the transmit path). The ORX path is also provided onto the same single die of the transceiver 204. The connection between the DPD module 206 and the ADC 252 can be provided by laying down copper tracks between the ADC 252's output buffer and the DPD module 206's input buffer. The need for a power hungry high speed serial data interface between the ADC 252 and the DPD module 206 is obviated, thereby providing even more power savings. To fully eliminate the need for the high-speed serial link, the transceiver may, preferably, also integrate all other functions that would otherwise require the ORX data including closed-loop gain control and (if required) VSWR measurement.

Integrating the DPD module and the ORX path on the same die allows the ORX path to be duty-cycled (turned on for only a fraction of the time that can be as low as 1-2%) to conserve significant power. Normally high-speed serial JESD204B interfacing lanes from ORX ADC block 152 cannot be easily brought up and down quickly which precludes ORX duty cycling, but, with the integration of DPD module, this high-speed serial interfacing is not needed so that duty cycling is possible. Note that a transceiver may still have a main receiver as in block 142, but the ORX receiver can be eliminated or used for other purposes such as transmit noise cancellation.

The transceiver 204 can further include a crest factor reduction (CFR) module 208 for limiting the dynamic range of the transmit signal. The CFR module 208 can be connected to an input of the DPD module 206. The CFR module 208 is also provided onto the same single die of the transceiver. Integrating the CFR module 208 has similar advantages as integrating the DPD module 206, since integrating the CFR module 208 with the transceiver 204 can potentially lower bandwidth and thus reducing power consumed by a serial interface link. Integrating the CFR module 208 can also reduce the complexity of the baseband processing 202, and can be particularly fitted for transceivers having 40 nanometer (nm) or smaller nodes.

Integrating Digital Up and Down Conversion

Although not shown in FIG. 2A, the chip boundary can continue to expand to the interface between modem 214 and DUC 210 (indicated with the dotted line). The high speed serial data interface would then be moved to said chip boundary. Phrased differently, the transceiver 204 can further include a digital up converter (DUC) module 210 for up converting a sample rate of a signal of the transmit path. The DUC module 210 is also provided onto the single die. At said chip boundary, the modem 214 provides signals for individual voice and data traffic channels at or close to baseband (at relatively low bandwidth), and the DUC 210 up converts the signal and then outputs the signal with a wider output bandwidth. For example, the input to DUC module 210 can be 5 megahertz, and the output of the DUC module 210 can be 100 megahertz with 20× increase in bandwidth. The input to the DUC module 210 potentially has the lowest signal bandwidth. The lower the interface is clocked, the lower the power consumption, especially when also considering the power savings of moving the chip boundary beyond the DPD module 206). Integrating the DUC module 210 can be particularly fitted for transceivers made with smaller nodes, e.g., 28 nm or smaller, which can allow high speed and dense digital functionality to be implemented on-chip onto the same die.

Likewise, the chip boundary can also expand to the connection between modem 214 and DDC 212 (indicated with the dotted line). The high speed serial data interface would be moved to said chip boundary. Phrased differently, the transceiver 204 can further include a digital down converter (DDC) module 212 for down converting a sample rate of a signal of the receive path. The DDC module 212 is also provided onto the single die, thus providing similar advantages as integrating the DUC module 210.

When many of the modules providing digital function are located as close as possible to the data converters (e.g., 252, 232, 242), power consumption as a result of the digital clocking is lowered as the chip boundary moves closer towards baseband.

Integrating Envelope Tracking for the Transmit Path

Figure 3:
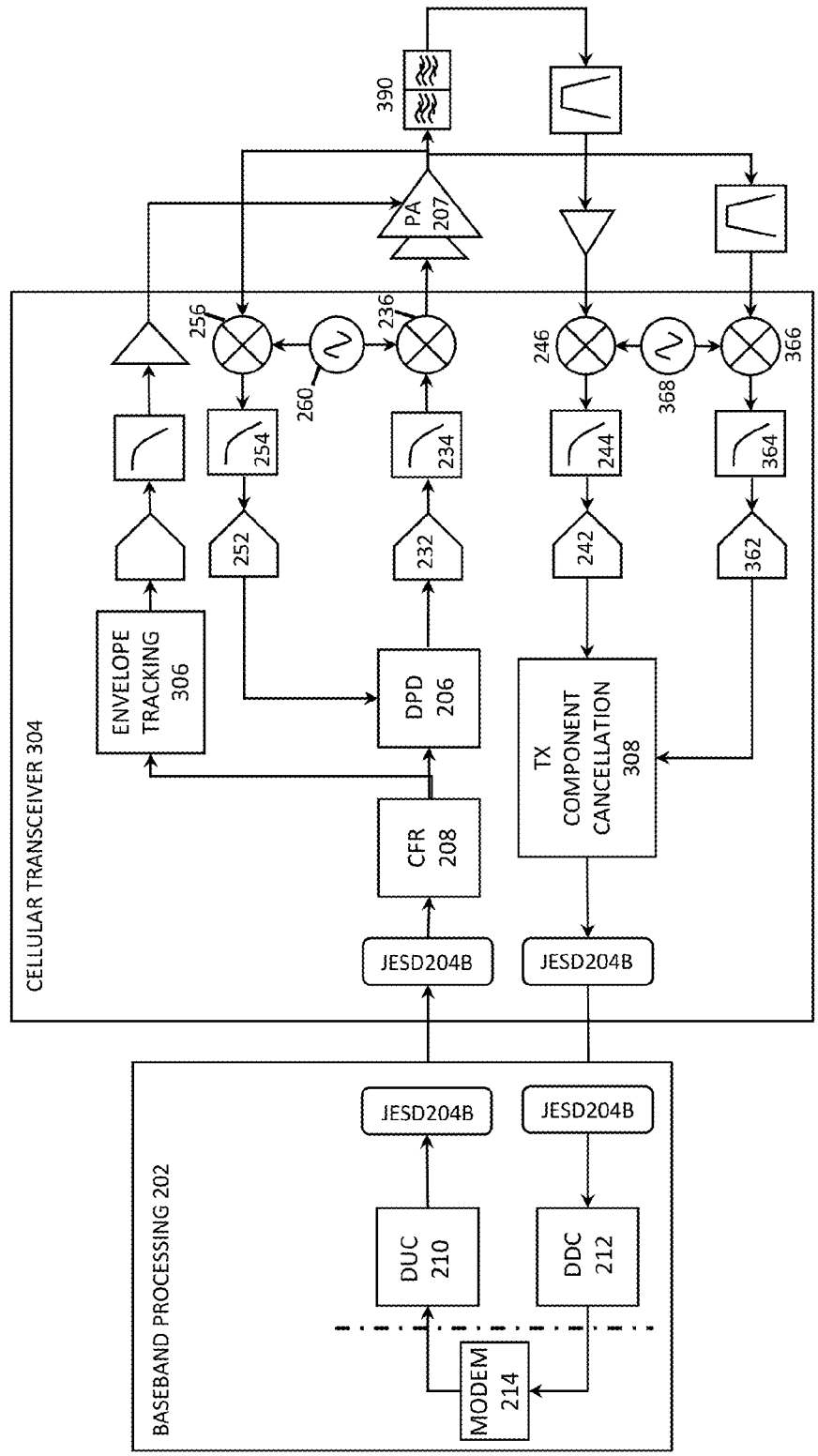
FIG. 3 illustrates another exemplary transceiver system including a highly integrated cellular transceiver having digital functions integrated on-chip, according to some embodiments of the disclosure.

FIG. 3 illustrates another exemplary transceiver system including a highly integrated cellular transceiver having digital functions integrated on-chip, according to some embodiments of the disclosure. The transceiver system includes baseband processing 202 and cellular transceiver 304. Besides the digital functions mentioned above, other digital functions can be integrated into the transceiver 304 as well. The transceiver 304 can include an envelope tracking module 306 for adjusting the power supply voltage applied to the power amplifier 207. The envelope tracking module 306 can continuously adjust the power supply voltage applied to the power amplifier 207 to ensure that the amplifier 207 is operating at peak efficiency for power required at each instant of transmission. The advantage of the envelope tracking module 306 is the improvement of transmit path efficiency. The envelope tracking module 306 is connected to an input to DPD module 206 (or output of CFR module 208), and the envelope tracking module 306 is also provided onto the single die. Advantageously, integrating envelope tracking module 306 reduces the complexity of baseband processing 202, and can potentially reduce costs of providing the transceiver system (by eliminating the need to include a separate discrete envelope tracking block).

Integrating Transmit Component Cancellation for the Receive Path

The transceiver 304 can further include a transmit component cancellation module 308 for filtering out one or more components of the transmit signal in the receive path (e.g., the transmit signal at the output of ADC 242), and an observation receive (ORX) path for observing the output of the power amplifier 207 and providing a feedback signal to the transmit component cancellation module 308. The ORX path can be represented by at least, e.g., a mixer 366, a filter 364, and ADC 362 (where the mixer 366 may share the same local oscillator (LO) 368 with the mixer 246 of the receive path). The transmit component cancellation module 308 and at least a part of the observation receive path are also provided onto the single die.

Figure 4:
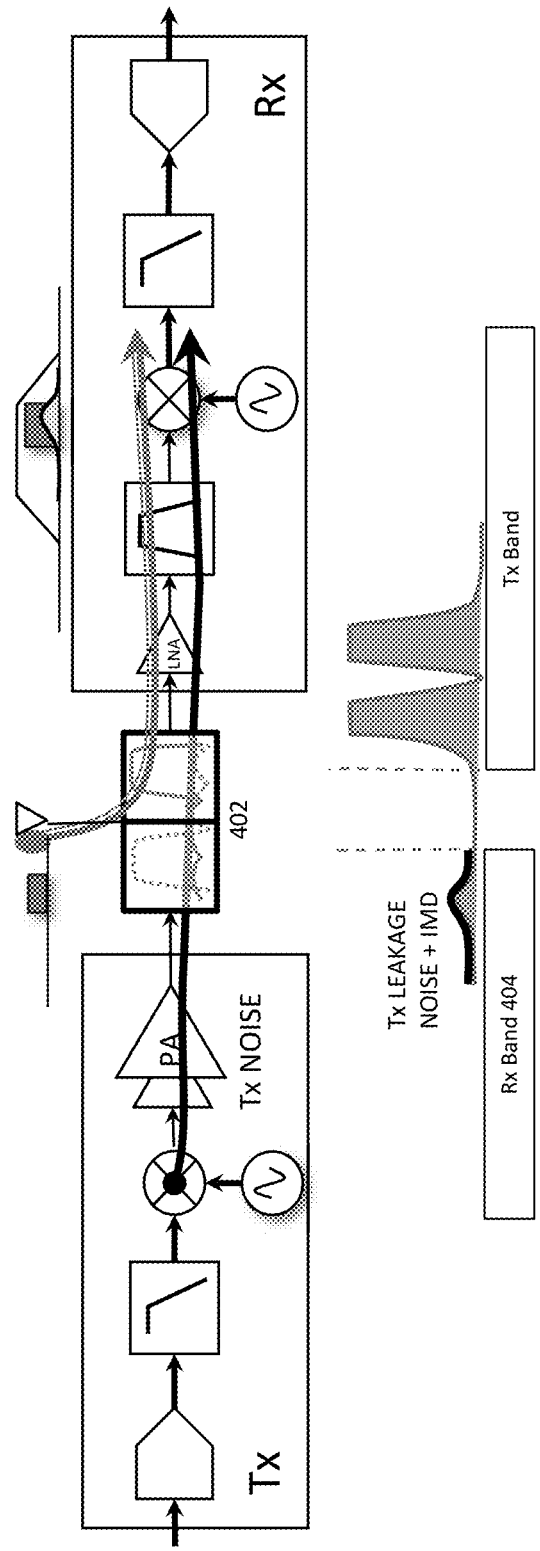
FIG. 4 illustrates one or more distortion components that is leaked from the first transmit path onto the first receive path, according to some embodiments of the disclosure.
Figure 5:
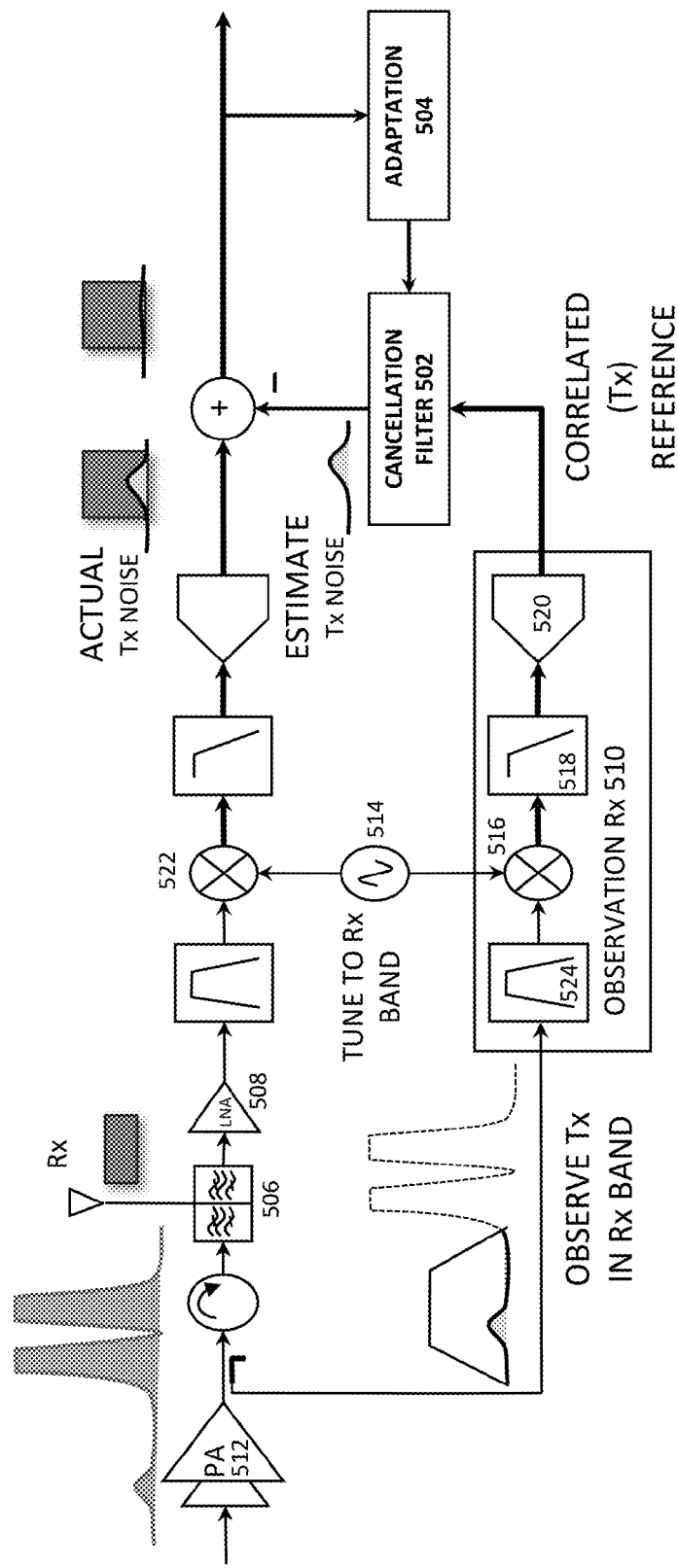
FIG. 5 illustrates an exemplary transmit component cancellation module that is integrated on-chip of a highly integrated cellular transceiver, according to some embodiments of the disclosure.
Figure 6:
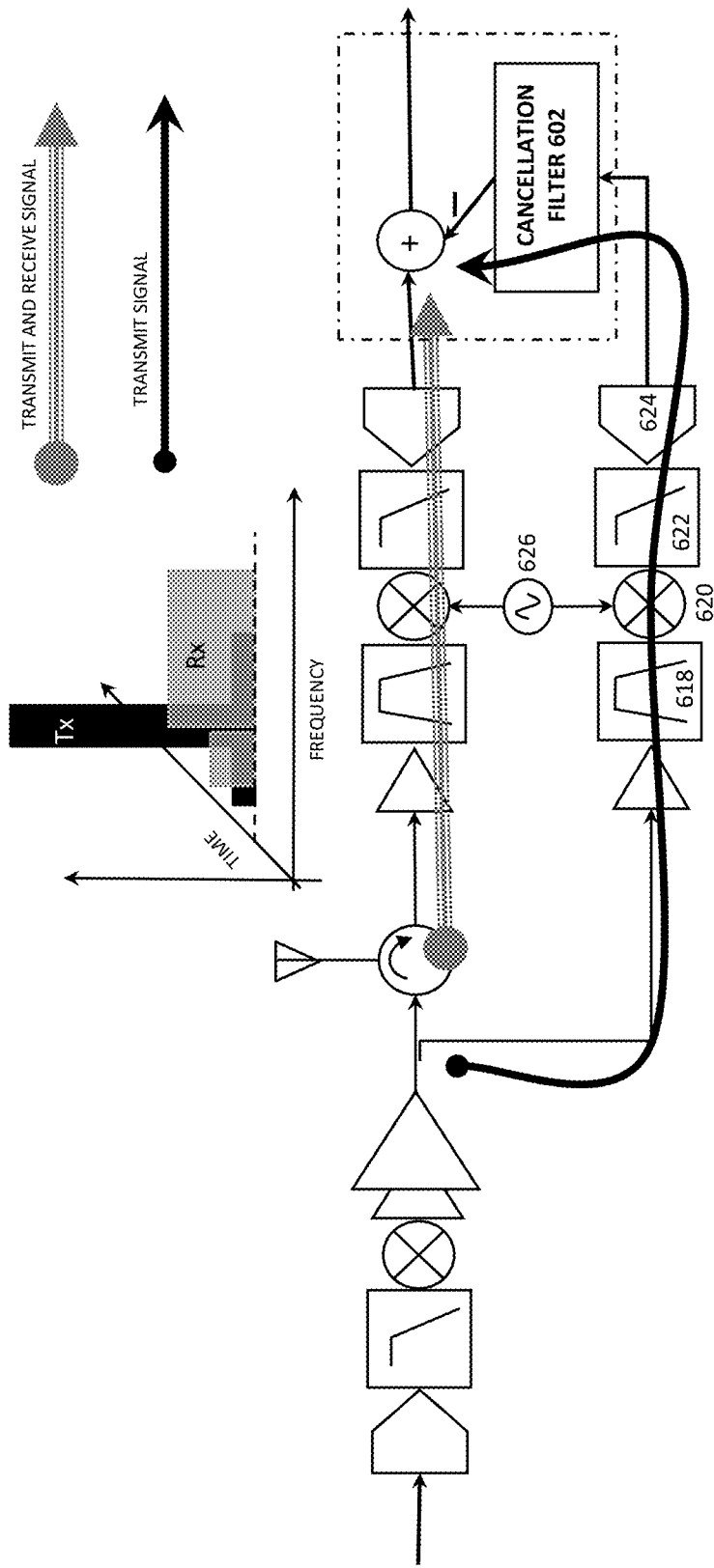
FIG. 6 illustrates another exemplary transmit component cancellation module that is integrated on-chip of a highly integrated full duplex cellular transceiver, according to some embodiments of the disclosure.

The transmit component cancellation module 308 can offer a variety of functions to improve the receive signal in the receive path, which are explained in further detail in relation to FIGS. 4-6. Further to those advantages, the integration of the transmit component cancellation module 308 is particularly beneficial. As seen in FIG. 3, the at least the part of the observation receive path being provided onto the single die of the transceiver 304 comprises a mixer 366 and a local oscillator (LO) 368 for matching the observation receive path with the receive path. It is noted that the transmit component cancellation module 308 is configured to filter out one or more components of the transmit signal (or any components that is derived based on the signal from the observation receive path) in the receive path. When filtering out components or subtracting components, the feedback signal being provided by the observation receive path is preferably well matched with the receive signal (e.g., signal at the output of ADC 362 is preferably well matched with the output of ADC 242). Conversely, if the signal being provided by the observation receive path is not well matched with the receive signal, good cancellation may be harder to achieve.

The tight integration can ensure that both the observation receive path and the main receive path have one or more of the following: matched receivers which have identical temperature variation, identical frequency response, a shared LO, shared ADC clocks, a common automatic gain controller (AGC) which can make tracking easier in dynamic conditions, and reduced interface bandwidth. Moreover, the more closely matched the main and observation receive paths are, the simpler the transmit component cancellation module 308 can be. Conversely, if the two paths are more dissimilar, more cancellation filter taps are required to equalize or match both paths.

Example of Transmit Component Cancellation: Transmit Noise or Distortion Cancellation FIG. 4 illustrates one or more distortion components that is leaked from the transmit path onto the receive path, according to some embodiments of the disclosure. Such distortion may be generated actively within the active circuitry of the transmitter and/or receiver such as the PA or LNA, for example, or passively within the passive circuitry, such as the duplexer or interconnecting cable. It can be seen from the FIGURE that when the transmit path and the receive path share the same antenna using a duplexer 402, some noise and/or intermodulation distortion components can be leaked onto the receive band 404 (e.g., leading to adjacent channel interference). If not addressed, the leakage from the transmit path can saturate and/or desensitizes the receive path. To address this issue, some high performance transceiver systems would include a costly low noise amplifier (LNA) on the receive path and/or expensive filtering/isolation in the duplexer, which can be a dominant cost and size component of the transceiver system (i.e., the radio). Integrating a transmit component cancellation module, when provided with suitable filtering, can advantageously relax the performance requirements of the LNA and/or duplexer, or if desired eliminate the requirements completely.

FIG. 5 illustrates an exemplary transmit component cancellation module that is integrated on-chip of a highly integrated cellular transceiver, according to some embodiments of the disclosure. The transmit component cancellation module 308 of FIG. 3 filters out one or more distortion components that is leaked from the transmit path onto the receive path, and is illustrated as cancellation filter module 502 and adaptation module 504. Normally, the leakage of the transmit path is addressed by having a costly duplexer 506 and LNA 508. With the cancellation filter module 502 and adaptation module 504, the requirements for the duplexer 506 and LNA 508 can be greatly reduced.

By following the receive path, the adaptation module 504 can sense the wanted receive signal (after the noise is subtracted), and provide the wanted receive signal as a feedback signal for the cancellation filter module 502. An observation receive path 510 is also included (represented by at least, e.g., a mixer 516, a filter 518, and an ADC 520), which is coupled to the output of the power amplifier 512. The observation receive path 510 can, if desired, be tuned to the main receive path by having the mixer 516 share the same LO 514 with the mixer 522 of the receive path. The observation receive path 510 observes the output of the power amplifier 512, and include suitable filtering (e.g., a filter 524) to observe any transmit component in the receive band. The observation receive path 510 outputs a feedback signal to the cancellation filter module 502, which can then estimate the leakage ("ESTIMATE Tx NOISE"). The estimated leakage can then be subtracted or filtered out of the receive signal, thereby providing the effect of isolation without requiring high performance in the LNA 508 and duplexer 506.

The illustration shown in FIG. 5 is based on the operations of Adaptive Interference Cancellation, where the observation receive path 510 senses the transmit signal at the output of the PA 512 prior to the duplexer 506 (while the observation receive path is tuned to the (main) receive path). An observed Correlated Reference is used to produce an estimate of transmit component leakage. The cancellation filter module 502 works with the adaptation module 504 in a least squares or minimum mean-square estimation sense to maximise cross correlation between observation receive path and the main receive path and minimize cross correlation between error (the leakage) and the observed receive signal. The result is the capability of being able to estimate the error (the leakage) and be able to remove it from the receive signal.

Integrating the transmit component cancellation module (e.g., the cancellation filter module 502 and adaptation module 504) and observation receive path (ORX path 510) on-chip and on the same die with the main receive path provides the advantage of being able to more easily match the observation receive path with the main receive path. The better matched the two paths are, the better the performance of the transmit component cancellation module. Furthermore, the transmit component cancellation module can be simpler, and perhaps less power hungry.

Example of Transmit Component Cancellation: Transmit Signal Cancellation for Full Duplex Radio Not only the transmit component cancellation module can relax the requirements of the duplexer, the transmit component cancellation module can even eliminate the duplexer completely. Instead of having a half duplex transceiver system, the transceiver system can be a full duplex transceiver system where the shared antenna of the transceiver can receive a receive signal and transmit a transmit signal concurrently (at the same time). On the receive path, the receive signal would also include the actual transmit signal from the transmit path (intentionally overlapping with the wanted signal in the receive path). Phrased differently, the transceiver is a full duplex transceiver, and the one or more components of the transmit signal being filtered out by the transmit component cancellation module (e.g., 308 of FIG. 3 if the duplexer 390 is removed) comprises one or more (actual) transmit signal components received on the receive path.

FIG. 6 illustrates another exemplary transmit component cancellation module that is integrated on-chip of a highly integrated full duplex cellular transceiver, according to some embodiments of the disclosure. In this example, the transmit component cancellation module 308 of FIG. 3 (if the duplexer 390 is removed) includes the cancellation filter module 602. Without the duplexer, the actual signal from the transmit path can intentionally overlap with the wanted signal in the receive path, and the receive path can receive the wanted receive signal and the transmit signal in the same frequency band. By providing the cancellation filter module 602, and an observation receive path (represented by at least, e.g., a first filter 618, a mixer 620, a second filter 622, and an ADC 624), the transmit signal can be measured and removed from the receive path. The observation receive path's mixer 620 can share the same LO 626 with the mixer of the main receive path for matching the two paths.

Advantageously, the expensive duplexer is no longer needed, and furthermore, the capacity of the spectrum is effectively doubled (which can be a significant advantage since spectrum is expensive). Furthermore, integration allows the main receive path (having the received transmit signal) to be matched better with the observation receive path (having the measured transmit signal), which can enable simpler and/or better cancellation. The tight integration can ensure that both the observation receive path and the main receive path have one or more of the following: matched receivers which have identical temperature variation, identical frequency response, a shared LO, shared ADC clocks, a common automatic gain controller (AGC) which can make tracking easier in dynamic conditions, and reduced interface bandwidth. The tight integration can enable better matching between the observation receive path and the main receive path, thus making it easier to achieve better performance of the cancellation filter module 602. Moreover, the more closely matched the main and observation receive paths are, the simpler the cancellation filter module 602 can be. Conversely, if the two paths are more dissimilar, the cancellation filter module 602 may need more cancellation filter taps are required to equalize or match both paths.

Sample Time Alignment Between Transmitted Samples and Received Observation Samples When the observation receive path is integrated onto the same die of the transceiver to assist the on-chip digital functions, some of the digital functions may include additional circuitry for aligning transmitted (TX) samples and received observation (ORX) samples in time. The digital functions can include the DPD module, and some modules to be described below (e.g., close-loop gain control module and voltage standing wave ratio monitoring module). Time alignment can be implemented by internally delaying TX samples an integer-sample delay-first-in-first-out buffer and an optional fractional-delay all-pass filter to bring them into alignment with the ORX samples for processing (e.g., cross-correlations).

If the loop delay between TX and ORX (including PA, cables, attenuators) does not change more than $1/16$-sample over time and temperature, the delay can be calculated once at startup and saved as a constant, especially if the cables are not adjusted during operation. To calculate the delay, a few approaches are possible. In one example, an internal broadband noise generator (a linear feedback shift register sequence) and the built-in cross-correlation engine to obtain $1/16$-sample alignment. This approach broadcasts very low-level broadband noise through the PA and may not be possible if the levels are too high and the antenna cannot be disconnected at start-up. In another example, the radio's own internal delay variable (which varies due to internal equalization filter group delays, etc.) can be learned and the user can program in the external-only path delay adder (from cables, etc.) determined during a factory calibration. This has the benefit of not requiring a signal be broadcast through the PA, but will require strict standardization of the external path so that the delay learned at factory calibration is accurate to $1/16$-sample. Alternatively, if these solutions are not workable, or the external path may change during operation, an online tracking algorithm that refines alignment while broadcasting real Federal Communications Commission (FCC) valid waveforms can be employed. This may take more time to converge and is more complicated, but can be realized if desired.

Integrating Observation Receive Path Gain Regulation

With the transceiver taking full control of one or more observation receive (ORX) paths, the transceiver is responsible for maintaining the gain index to prevent saturation and to ensure good received signal level. To maximize of various digital functions, the ORX gain index should be adjusted so that the received signal has peaks backed off by, e.g., about 3 dB from full-scale (−3 dBFS) to give a good trade-off between ORX linearity, and signal-to-noise ratio. The transceiver can further include a gain regulation module for adjusting a gain index for any one or more observation receive paths, wherein the gain regulation module is also provided onto the same single die. The gain regulation can be provided by a built-in automatic gain control (AGC) module and received signal strength indicator module in the transceiver.

Integrating Close-Loop Gain Control for the Transmit Path

Figure 7:
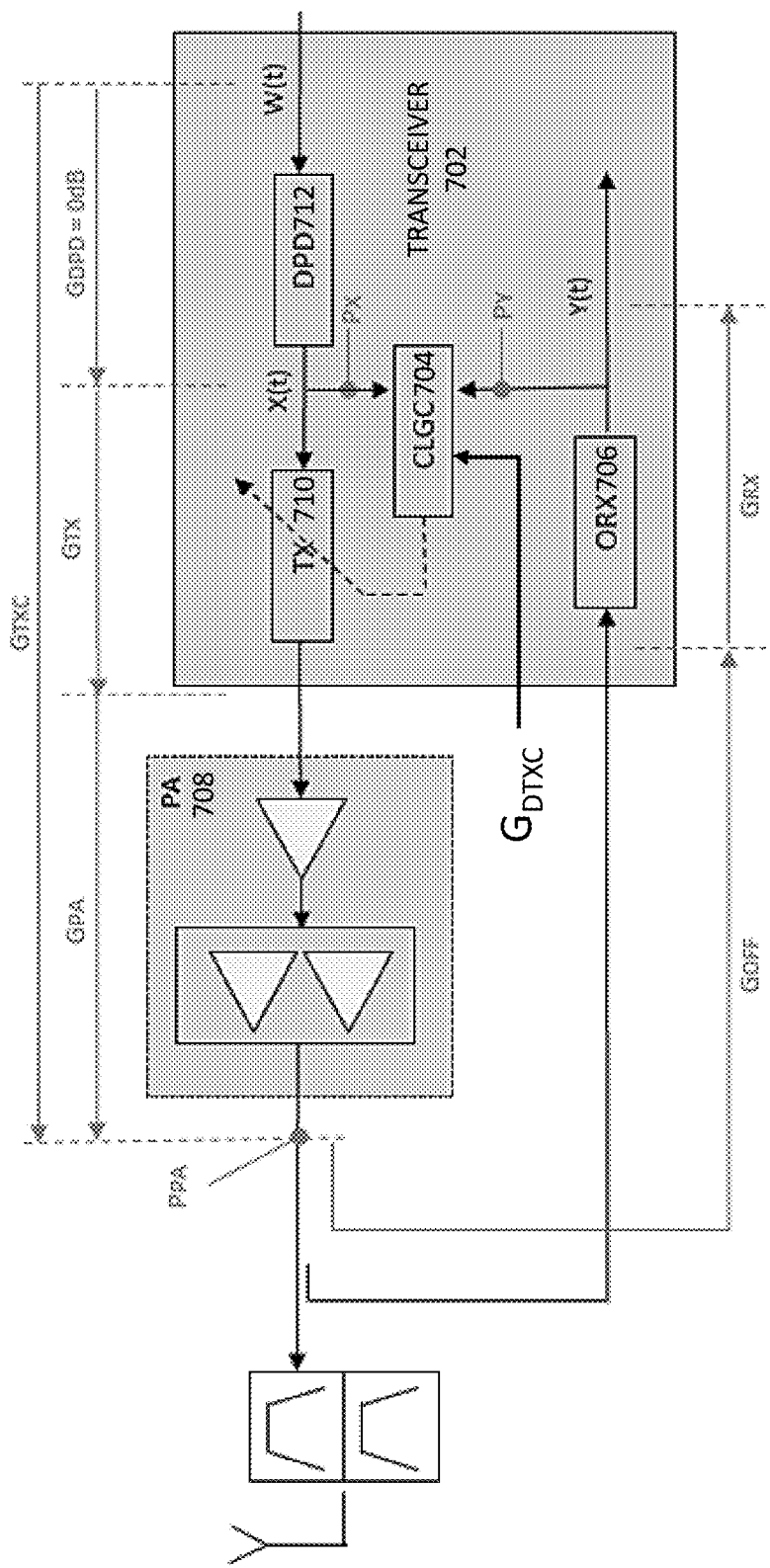
FIG. 7 illustrates an exemplary close-loop gain control module that is integrated on-chip of a highly integrated cellular transceiver, according to some embodiments of the disclosure.

Besides controlling the gain of the ORX paths, digital functions on-chip, provided on the same single die of the transceiver, can also control the gain of the transmit path. FIG. 7 illustrates an exemplary close-loop gain control module that is integrated on-chip of a highly integrated cellular transceiver, according to some embodiments of the disclosure. The transceiver 702 includes a closed-loop gain control (CLGC) module 704 for controlling the gain of the transmit path. Also, the transceiver 702 includes an observation receive (ORX) path 706 for observing the output of the power amplifier 708 and providing a feedback signal to the closed-loop gain control module 704. The closed-loop gain control module 704 and at least a part of the ORX path 706 are also provided onto the single die with the transceiver 702. When the ORX path 706 is provided on-chip onto the same die with the main transmit path, the CLGC module 704 can advantageously make measurements of the gain in a more controlled environment, thus providing better or simpler gain control. To provide gain control, the CLGC module 704 can estimate the gain of the transmit path ($G_{TXC}$) based on at least signal power measurements of an output of the digital pre-distortion module 712 ($P_X$) and the feedback signal ($P_Y$).

CLGC module 704 regulates the combined gain of the transmit chain components (including the transceiver and power amplifier) to a desired gain value by adjusting the radio's internal transmit (TX) 710 attenuation. The CLGC module 704 can advantageously receive a user-provided parameter that specifies a desired gain of the transmit path ($G_{DTXC}$) and control the gain of the transmit path ($G_{TXC}$) based on the user-provided parameter. Phrased differently, a user does not need to directly adjust the TX 710 attenuation ($G_{TX}$), but instead, the user can input or select a desired transmit-chain gain ($G_{DTXC}$) for the full transmit chain, e.g., specified in units of dBm at full-scale digital (0 dBFS). The CLGC algorithm adjusts $G_{TX}$ so that the actual (estimated) TX-chain gain $G_{TXC}$ equals the desired $G_{DTXC}$.

The transmit chain can be initially configured such that the maximum output power desired from the PA 708 is nominally obtained with at least a TX 710 attenuation of 7-10 dB. This gives room for the algorithm in CLGC module 704 to increase the gain to compensate for gain variations in the PA 708 ($G_{PA}$). Typical gain variations are 13 dB but a total 30 dB range can be implemented. The absolute TX-chain gain regulation accuracy can be 1 dB or better.

In a given user configuration, there is a reference offset level ($G_{OFF}$) that may be determined. This can include the physical attenuation from the PA 708 output to the ORX path 706, e.g., including couplers, splitters and cable losses. Additionally, there may be some variation in the base ORX path 706 receive gain due to matching and other variations. To calibrate out $G_{OFF}$, an initial setup procedure can be performed. A user can transmit or provide a typical constant-power reference waveform and set the TX 710 attenuation ($G_{TX}$) to give a reasonable operating level for the PA 708. The user can then use a calibrated power meter instrument to measure the observed PA 708 output power (in dBm). This value ($P_{PA}$) can be reported or written to the transceiver 702. The transceiver can report or provide the digital TX signal power $P_X$ (after the DPD 712) in units of dBFS and subtract it from the provided PA output power measurement ($P_{PA}$) to give the current TX-chain gain $G_{TXC}$ (in units of dBm at 0 dBFS). Note that DPD 712 can seek to preserve the total PA output power, including adjacent channel leakage power before and after its correction. Effectively, any out-of-band power can be moved in-band after DPD correction. A few iterations of DPD can be run before making any in-band power measurement so that the value is accurate. The transceiver 702, i.e., the CLGC module 704, can measure the digital ORX signal power $P_Y$ in units of dBFS. The difference between this value $P_Y$ and the provided PA power measurement $P_{PA}$ is representative of the reference offset level $G_{OFF}$:

$$G_{OFF}=P_{PA}-G_{ORX}-P_Y$$

The ORX path 706 gain index $G_{ORX}$ can removed after possible non-linear correction. The reference offset $G_{OFF}$ can remain constant over time and can be saved.

When CLGC module 704 is in operation, the CLGC module 704 can periodically (e.g., every 250 ms, or at least ever 1 second) adjusts the TX 710 attenuation ($G_{TX}$) to drive $G_{TXC}$ to the desired TX-chain gain $G_{DTXC}$ set point. To estimate the current $G_{TXC}$, the algorithm measures the digital TX signal ($P_X$) and digital ORX signal power ($P_Y$). The CLGC module 704 then subtracts off the reference offset level measured at startup ($G_{OFF}$) and the current ORX gain index ($G_{ORX}$) to obtain an estimate of the current $G_{TXC}$.

$$G_{TXC}=P_X-P_Y-G_{OFF}-G_{ORX}$$

The algorithm then adjusts the TX 710 attenuation to compensate for any error:

$$G_{TX}(n-1)=G_{TX}(n)+(G_{DTXC}-G_{TXC})$$

As described above, an algorithm of the CLGC module 704 can depend on various gain indexes of the transceiver system as well as the gain of the PA 708. For this reason, the closed-loop gain control module 704 is configured to update the gain of the transmit path (e.g., by adjusting TX 710 attenuation) in response to one or more changes in the transceiver affecting the gain of the transmit path ($G_{TXC}$). These changes include updates of the algorithm in DPD 712 (which could affect $G_{DPD}$), or bias control changes affecting the gain of PA 708. The CLGC module 704 can be coupled to digital control functions that affect the gain indexes, such that those digital control functions (or modules) can transmit information about the updates/changes and/or notification of the updates/changes to the CLGC module 704 and determine the appropriate adjustment for the gain of the transmit path based on the information and/or notification.

Integrating Voltage Standing Wave Ratio Monitoring for the Transmit Path

Besides gain control, other digital functions can be provided on-chip, onto the same die, to improve the efficiency of the transceiver system. One digital function is voltage standing wave ratio (VSWR) monitoring. The voltage standing wave ratio is an important indicator of the efficiency of a transmission system (i.e., the transmitter of the transceiver system). On a typical transmission line, a standing wave pattern is generated by the combination of forward and reverse-reflected traveling waves on the line. Reflected waves are caused by mismatched characteristic impedances of the stages of the transmission system and a large reflection indicates a poor matching and transmission efficiency. VSWR is defined as the ratio between the maximum voltage envelope and the minimum voltage envelope of the standing wave pattern. Measurement of the VSWR can be used in the field both at start-up and during operation to diagnose mismatches or to detect error conditions (e.g., antenna disconnected).

Given a complex-valued reflection coefficient Γ defined as, $$\Gamma = \frac{V_{rev}}{V_{fwd}}$$

The voltage standing wave ratio is directly determined from this coefficient, $$VSWR = \frac{|V(x)|_{max}}{|V(x)|_{min}} = \frac{1+|\Gamma|}{1-|\Gamma|}$$

Figure 8A:
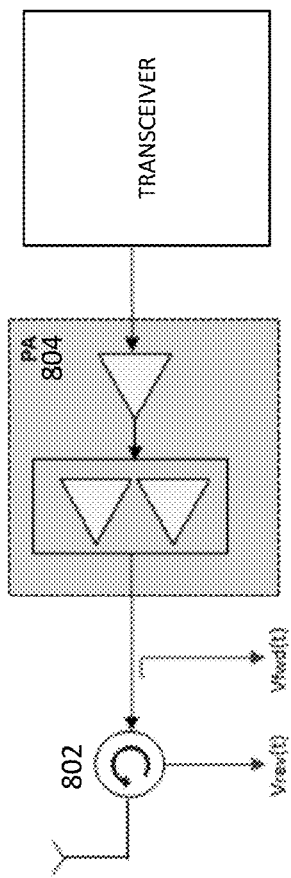
FIG. 8A illustrates voltage standing wave ratio and how it can be measured, according to some embodiments of the disclosure.

FIG. 8A illustrates voltage standing wave ratio and how it can be measured, according to some embodiments of the disclosure. Physically, an in-line measurement of VSWR can be made by introducing a circulator 802 at the output of the power amplifier 804, and separately measuring the forward traveling wave $V_{fwd}(t)$ and the reverse/reflected traveling wave $V_{rev}(t)$.

Figure 8B:
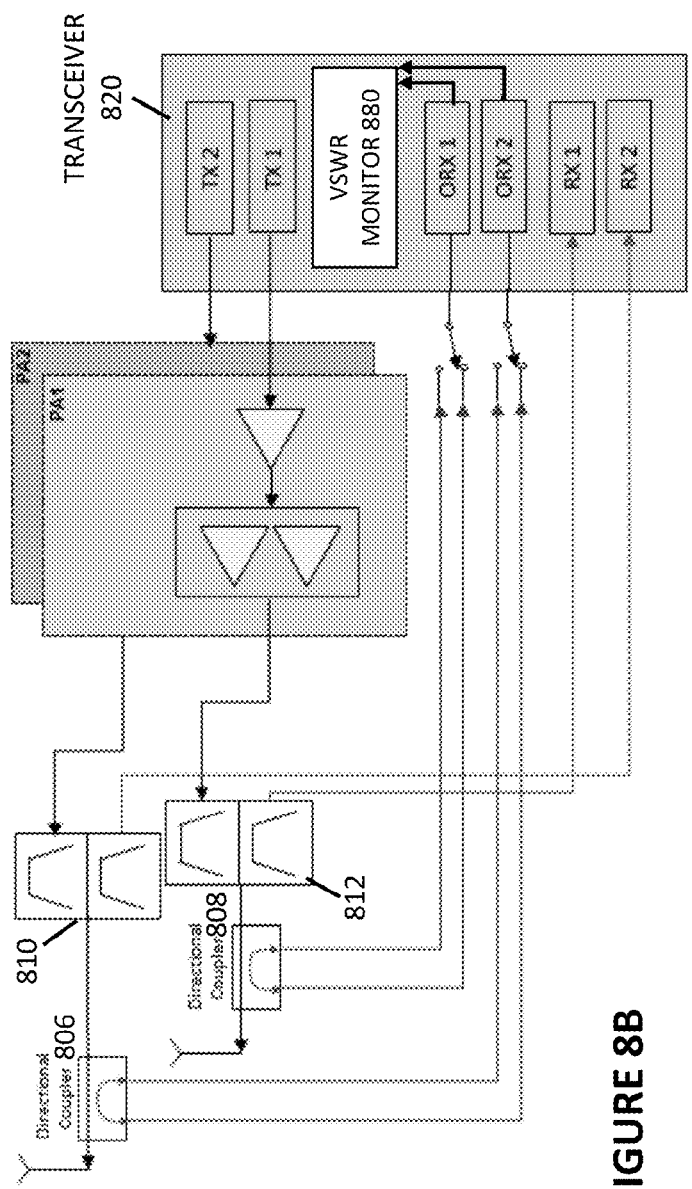
FIG. 8B illustrates an exemplary voltage standing wave ratio monitoring module that is integrated on-chip of a highly integrated cellular transceiver, according to some embodiments of the disclosure.

FIG. 8B illustrates an exemplary voltage standing wave ratio monitoring module that is integrated on-chip of a highly integrated cellular transceiver, according to some embodiments of the disclosure. This example shows two transmit channels/bands for the transceiver 820 (although any suitable number of channels can be provided). The VSWR for each channel can be measured separately. The transceiver 820 includes a voltage standing wave ratio monitoring module 880 for measuring voltage standing wave ratio, an observation receive path (or a plurality of observation receive paths) (e.g., ORX 1 and/or ORX 2) for observing a forward traveling wave at the output of the power amplifier and providing a feedback signal for the forward traveling wave to the voltage standing wave ratio monitoring module and for observing a reverse traveling wave at the output of the power amplifier and providing a feedback signal for the reverse traveling wave to the voltage standing wave ratio monitoring module. The VSWR monitoring module 880, at least a part of the observation receive path, are also provided onto the single die.

It can be seen from the FIGURE that the circulator 802's function is provided using a directional coupler (e.g., 806, 808) at the on the antenna side of the duplexer (e.g., 810, 812). Dual-directional couplers can be used for better isolation. The forward traveling wave $V_{fwd}(t)$ and the reverse/reflected traveling wave $V_{rev}(t)$ at antenna end of the duplexer can be measured so that the observation receive path can provide feedback signals to VSWR monitoring module 880 (switching can be provided to select the forward traveling wave or the reverse/reflected traveling wave). The feedback signals allow the VSWR monitoring module 880 to make measurements to calculate VSWR.

One possible approach to measuring VSWR is to use root mean square detectors to (simultaneously) measure the forward and reverse signal power, and to compute the ratio to get, $$|\Gamma| = \frac{RMS\{V_{rev}(t)\}}{RMS\{V_{fwd}(t)\}} = \left(\sqrt{\sum_{t=t_1}^{t_2}|V_{ref}(t)|^2}\right) \Bigg/ \left(\sqrt{\sum_{t=t_1}^{t_2}|V_{fwd}(t)|^2}\right)$$

While the above expression does not give exact reflection phase information, the above expression can be sufficient for estimating VSWR (at perhaps lower cost). To get simultaneous measurements, it is possible to switch in two observation receive paths (e.g., ORX 1 and ORX 2) to simultaneously measure RMS of forward and reverse signals in a given transmitter.

Figure 8C:
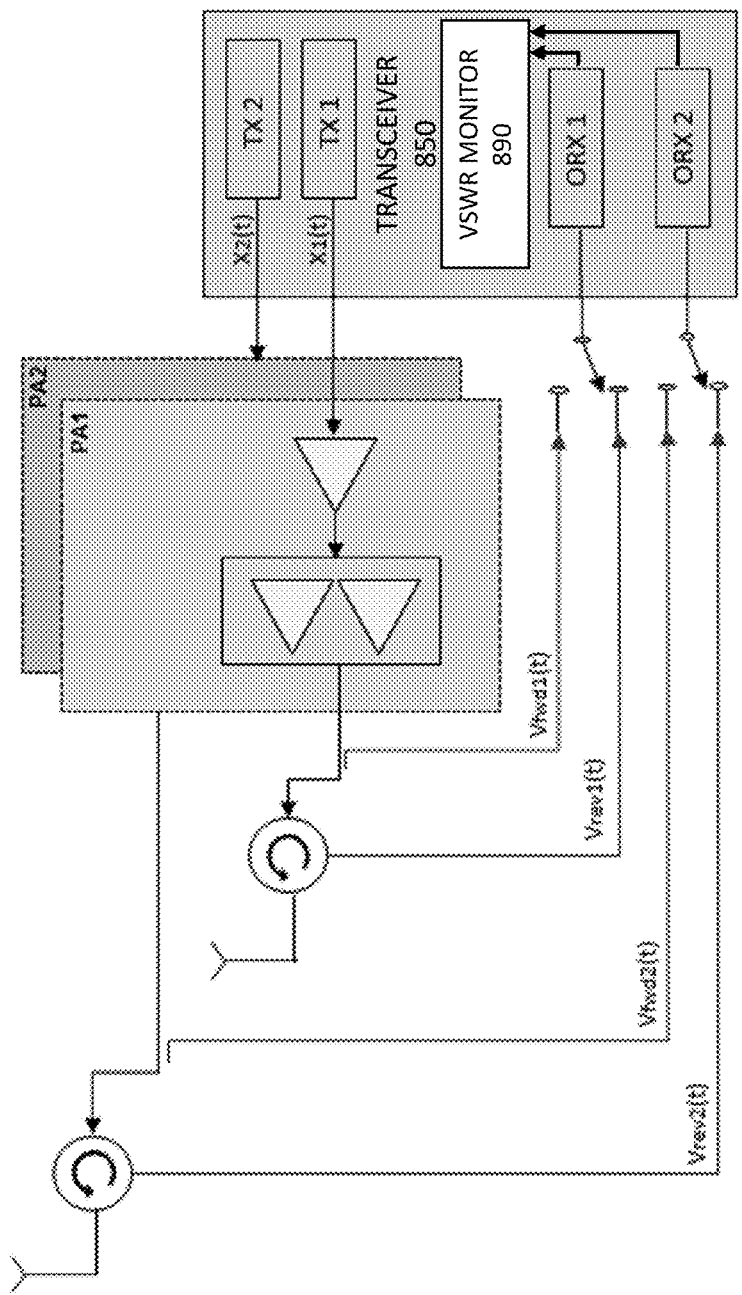
FIG. 8C illustrates another exemplary voltage standing wave ratio monitoring module that is integrated on-chip of a highly integrated cellular transceiver, according to some embodiments of the disclosure.

Another possible approach is to perform VSWR measurements independently in one transmitter chain by using the same ORX twice to make two measurements separated in time. FIG. 8C illustrates another exemplary voltage standing wave ratio monitoring module that is integrated on-chip of a highly integrated cellular transceiver, according to some embodiments of the disclosure. It can be seen that the VSWR monitoring module 890 and ORX 1 and ORX 2 can be configured to make two measurements separated in time. For example, a measurement of $V_{rev}(t)$ is taken during $t\in[t_1; t_2]$ with an ORX switch set to the circulator, then the switch is set to the PA output and $V_{fwd}(t)$ is measured during $t\in[t_3; t_4]$. An absolute RMS power measurement may vary at these two times because the TX data signal power may change. However, the ratio of an ORX signal divided by the digital TX transmit data X(t) at that same time should be constant over time. By normalizing by the RMS of the transmit data X(t) over each time periods, the reflection coefficient magnitude can still be found, $$|\Gamma| = \frac{\left(\sqrt{\sum_{t=t_1}^{t_2}|V_{ref}(t)|^2}\right)\Big/\left(\sqrt{\sum_{t=t_1}^{t_2}|X(t)|^2}\right)}{\left(\sqrt{\sum_{t=t_3}^{t_4}|V_{fwd}(t)|^2}\right)\Big/\left(\sqrt{\sum_{t=t_3}^{t_4}|X(t)|^2}\right)}$$

A similar correlation-based approach can further give the Γ phase value which is beneficial because it can be used for "macro-parity". The complex-valued scalings between the transmit data X(t) and the ORX signals are, $V_{ref}(t)=\alpha X(t)$, $\beta \in \mathbb{C}$ (ORX switch set to reflection signal from circulator)

$V_{ref}(t)=\beta X(t)$, $\alpha \in \mathbb{C}$ (ORX switch set to PA output signal)

A noise-robust least-squares estimates of α and β are computed by cross-correlating the complex-valued baseband signals, $$\hat{\alpha} = \left(\sqrt{\sum_{t=t_1}^{t_2} V_{rev}(t)X^*(t)}\right) \Bigg/ \left(\sqrt{\sum_{t=t_1}^{t_2} X(t)X^*(t)}\right)$$

-continued $$\hat{\beta} = \left(\sqrt{\sum_{t=t_3}^{t_4} V_{fwd}(t)X^*(t)}\right)\left(\sqrt{\sum_{t=t_3}^{t_4} X(t)X^*(t)}\right)$$

From which the reflection coefficient is found by taking the ratio, $$\Gamma = \frac{\hat{\alpha}}{\hat{\beta}}$$

Note, TX/ORX sample time-alignment can be more critical with this approach because the accuracy of $\hat{\alpha}$ and $\hat{\beta}$ can be sensitive to time-alignment. Additionally, the phase measured by this method can depend on the VSWR and matching during the time-alignment calibration phase. When the VSWR measurement system is provided on-chip on the same die, such time-alignment between TX and ORX samples is advantageously far better controlled (which can enable more accurate VSWR measurements. Therefore, $\Gamma$ phase values may only be compared over time (relative value) unless some initial phase calibration is performed.

After computing $\Gamma$ (magnitude and possibly phase), the results (i.e., the VSWR measurements) can be sent by the VSWR monitoring module over a serial data interface to the baseband processor. Measurements can be updated approximately every 1 second. The voltage standing wave ratio monitoring module in some of the examples can be configured to receive a user-provided parameter that specifies the number of voltage standing wave ratio measurements to be made, how often to make the measurements, and/or the number of measurements to be made before sending them over the serial data interface, etc.

Integrating Power Amplifier Bias Control

Figure 9:
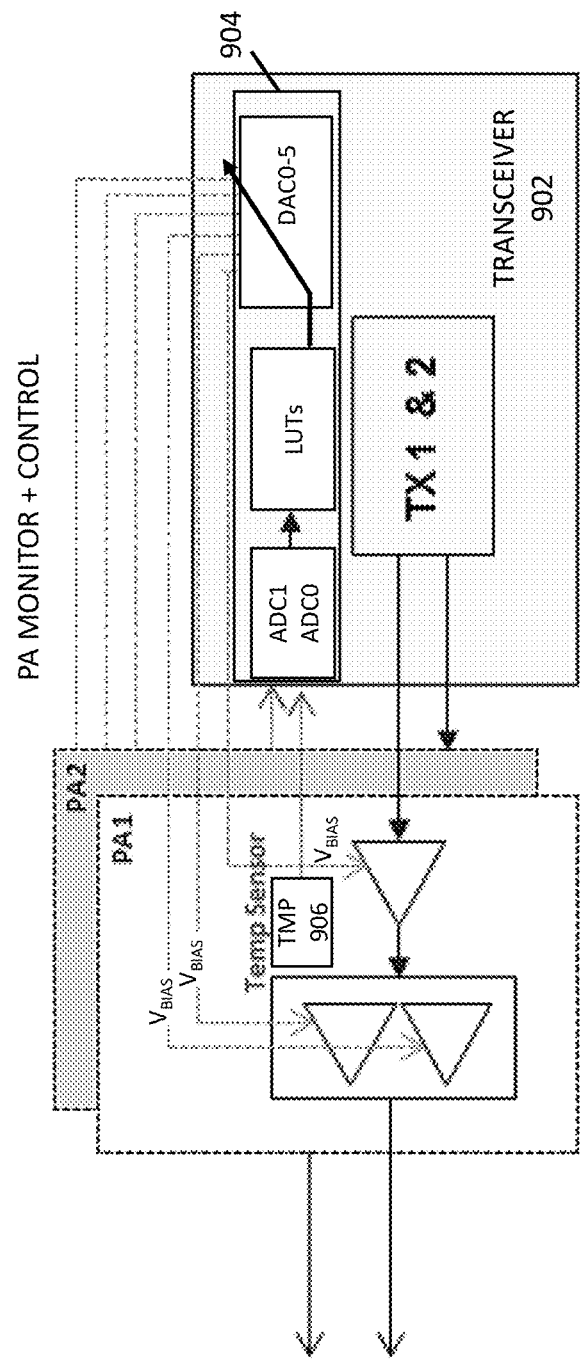
FIG. 9 illustrates an exemplary power amplifier bias control module that is integrated on-chip of a highly integrated cellular transceiver, according to some embodiments of the disclosure.

Another useful digital function that can be integrated into the transceiver is power amplifier bias control. FIG. 9 illustrates an exemplary power amplifier bias control module that is integrated on-chip of a highly integrated cellular transceiver, according to some embodiments of the disclosure. The transceiver 902 includes a power amplifier (PA) bias control module 904 for monitoring and controlling the power amplifier, wherein the power amplifier bias control module is also provided onto the single die of the transceiver 902. Specifically, the power amplifier bias control module 904 can measure the power amplifier temperature and adjust the bias voltages of various PA stages to maintain gain consistency and improve PA efficiency. In one example, the PA bias control module 904 can run once a second. As shown in the example, the power amplifier bias control module 904 provided on-chip onto the same die as the transceiver 902 can include one or more ADCs, one or more look up tables (LUTs), and one or more DACs. The ADCs and DACs can be (built-in) auxiliary ADCs/DACs, which means integrating PA bias control module 902 does not require adding ADCs and DACs to the transceiver 902. During operation, the power amplifier bias control module is configured to receive one or more temperature sensor measurements from a temperature sensor 906 of the power amplifier. The power amplifier bias control module can include one or more ADCs for converting the one or more temperature sensor measurements (from the temperature sensor 906 at the PA) to one or more digital temperature sensor measurement values. The PA bias control module 904 further comprises one or more look up table (LUTs) and/or one or more mapping functions (e.g., a line, a curve, or a low-order polynomial) for mapping digital temperature sensor measurement values to bias voltage values. These values of the LUTs or the mapping function can be provided by a user, or selected by a user. For instance, the look up table and/or mapping function is configurable by a user through a user interface of the transceiver. A constant offset can be programmed to input of LUT for an individual PA (e.g., calibrated at reference temperature). Depending on the application, the LUT may have different resolutions (e.g., 2 degree Fahrenheit). Instead of storing a LUT, a low-order polynomial can be used to advantageously reduce memory and to interpolate between values. The power amplifier bias control module 904 further comprises a digital to analog converter for converting one or more bias voltage values to analog bias voltage values. The power amplifier bias control module 904 is configured to output one or more analog bias voltage values to the power amplifier.

The PA bias control module 904 can be particularly advantageous in transceiver systems where the power amplifier is also provided onto the same die of the transceiver 902, because the monitoring and control can be all provided internally on-chip (reducing any interfaces and inefficiencies of passing signals between the power amplifier and the transceiver 902).

Architecture or System Considerations

As described extensively herein, the integration of digital functions into the transceiver provides a complete radio frequency (RF) system solution while at the same time, achieves greater system efficiency than putting together the RF system through discrete parts. Such a highly-integrated transceiver can provide high performance while reducing cost, power consumption, and complexity for the user, which can be particularly useful when the transceiver is part of a small cell (e.g., femtocell, picocell, microcell).

One example of such system efficiency is the reduction of bandwidth, i.e., reduction of lanes at the interface between the baseband processor and the transceiver (and in some cases, the elimination of lanes for the ORX path), which results in significant power savings. Another example of system efficiency is that the highly integrated cellular transceiver greatly simplifies customer design and removes many discrete components used in providing the digital control functions. Yet another example of such system efficiency is the ability to greatly simplify scheduling and interaction of other calibrations (e.g., no ORX contention or sharing of the ORX path, since the transceiver has complete control over the ORX path).

Figure 10:
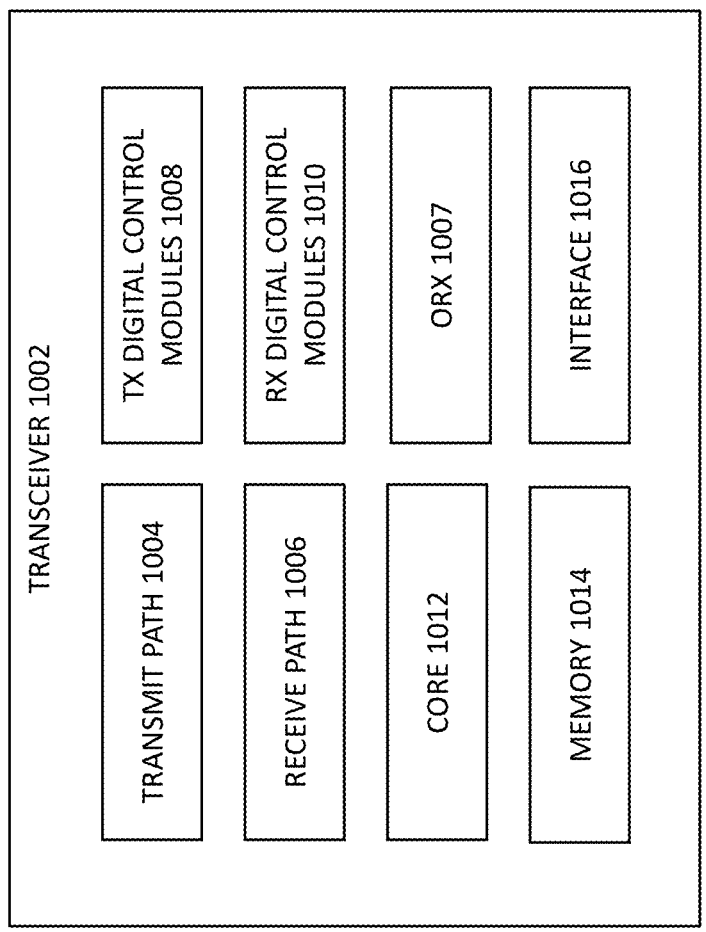
FIG. 10 shows an exemplary block diagram of an illustrative highly integrated cellular transceiver system having digital functions integrated on-chip, according to some embodiments of the disclosure.

FIG. 10 shows an exemplary block diagram of an illustrative highly integrated cellular transceiver system having digital functions integrated on-chip, according to some embodiments of the disclosure. The transceiver 1002 would normally include one or more transmit paths 1004 and one or more receive paths 1006. Moreover, the transceiver 1002 may include one or more transmit-related digital control modules 1008, e.g., for controlling any one of the transmit path(s) 1004 and/or power amplifier(s), and one or more receive-related digital control modules, e.g., for controlling any one of the receive path(s) 1006 and/or baseband processing. Many examples of such modules are described herein, e.g., DPD, CFR, DUC, DDC, envelop tracking, transmit component cancellation, time-alignment of TX and ORX, observation path receive gain regulation, close-loop gain control for the transmit path, VSWR monitoring, PA bias control, etc. Any suitable and feasible combination of such modules being provided on-chip with the transceiver onto the same die is envisioned by the disclosure. For instance, it is possible to integrate the transmit component cancellation without integrating DPD. To provide their respective digital functions, the transmit-related digital control module(s) 1008 would normally receive one or more feedback signals provided by one or more observation receive paths (ORX) 1007.

For instance, the transceiver 1002 can include a digital control module for controlling a part of the transceiver, and an observation receive path for observing the output of the power amplifier and providing a feedback signal to the digital control module. The digital control module and at least a part of the observation receive path are also provided onto the single die with the transceiver. In some cases, where matching of the paths is desired, the at least the part of the observation receive path being provided onto the single die comprises a mixer and a local oscillator for matching the observation receive path with the transmit/receive path. The two paths may have matched receivers which have one or more of the following characteristics: identical temperature variation, identical frequency response, a shared LO, shared ADC clocks, a common automatic gain controller (AGC) which can make tracking easier in dynamic conditions, and reduced interface bandwidth.

In some implementations, at least some parts of the digital functions can be carried out by a microprocessor core 1012 that is provided on-chip, onto the same die of the transceiver. The core 1012 can execute digital functions or algorithms using instructions stored in memory 1004. The transceiver may include memory 1014 for storing such instructions, and furthermore, for storing look-up tables, indexes, values, and any suitable data being used or generated by the digital control functions.

To facilitate configurability, any of the digital control modules can receive one or more user-provided (configuration) parameters that usable for controlling any one part of the transceiver 1002, or in some cases, usable for affecting measurements being made on any one part of the transceiver 1002 (and/or the PA). Such a feature allows users to adapt the system to different applications. The parameters can provide tremendous flexibility. The transceiver 1002 can include an interface 1016 configured to allow a user to configure the transceiver 1002 with one or more configuration parameters usable by one or more (digital control) modules of the transceiver 1002. The parameters may include one or more of the following or be associated with: desired values, initial reference values, look-up tables, functions, error tolerances, modes of operation, power efficiency, performance metrics/requirements, type of measurements, number of measurements, duration of measurements, timing of measurements/algorithms, selection of algorithms, selectively turning certain algorithm(s) on or off, transmit or receive path parameters, calibration algorithm parameters, turn on or off certain channels, selected bandwidth, selecting full duplex or half duplex, selecting DPD function, DPD function parameters, selecting different digital functions, providing different parameters for the digital functions, instructions/code for a function, etc.

To offer more functionality, the interface 1016 can provide one or more hooks allowing a user to sample one or more signals in the transceiver, and/or one or more hooks allowing a user to inject one or more signals in the transceiver. This feature can be particularly useful for calibrating or setting up the transceiver 1002 and/or digital control modules of the system, and enable certain debug functions of the transceiver 1002

To offer even more functionality, the interface 1016 can be configured to allow an external device to read from and/or write to a memory of the transceiver (e.g., memory 1014), wherein the memory is also provided onto the single die. The interface 1016 can be any suitable serial data interface, including ports/pins which allows data to be passed in and out of the transceiver.

To offer further functionality, the interface 1016 can be connectable to an electronic display and/or a user input device for providing an interactive user interface that allowing by a user to configure the transceiver with one or more configuration parameters. For instance, the interface 1016 include a command line interface, a graphical user interface, etc.

Besides the many components provided on-chip and on the same die as the transceiver, it is also possible further provide the power amplifier for the transmit path provided onto the single die to provide even a higher extent of integration. Such integration can make observation at the output of the power amplifier simpler and easier, and may improve the performance (and reduce the complexity) of PA digital controls.

The embodiments described herein are NOT to be confused with systems where the transceiver and digital functions are provided in a single system on chip (SoC). An SoC represents an part that integrates components of a computer or other electronic system into a single small package. While SoCs may contain digital, analog, mixed-signal, and often radio frequency functions, all of which may be provided on a single package, the interfaces between different parts of an SoC are still required (e.g., instead of simply laying down copper tracks between inputs and outputs of the different parts of a system), and such interfaces can be very power hungry.

Variations and Implementations

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

Parts of various highly integrated cellular transceiver system can include electronic circuitry, preferably digital circuitry (although analog circuitry can also be used), to perform the functions described herein. In some cases, one or more parts of the apparatus can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer medium.

In one example embodiment, any exemplary transceiver described herein may be provided on a board of an associated electronic device, e.g., to provide a small cell. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims (if any) or the appended examples. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims (if any) or the appended examples. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the digital functions for the transceiver, illustrate only some of the possible functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims (if any) or the appended examples. Note that all optional features of the apparatus described above may also be implemented with respect to the method or process described herein and specifics in the examples may be used anywhere in one or more embodiments.

Selected Examples

Example 1

A highly integrated cellular transceiver having digital functions on-chip, the transceiver comprising: a first transmit path for transmitting a transmit signal; a first receive path for receiving a receive signal; and a digital pre-distortion module for improving the linearity of the transmit path and/or a power amplifier for the transmit path; wherein the first transmit path, the first receive path, and the digital pre-distortion module are provided onto a single die.

Example 2

The transceiver of Example 1, can optionally include: a first observation receive path for observing the output of the power amplifier and providing a first feedback signal to the digital pre-distortion module; wherein the first observation receive path is also provided onto the same single die.

Example 3

The transceiver of any one of the above Examples, can optionally include: a crest factor reduction module for limiting the dynamic range of the transmit signal; wherein the crest factor reduction module is connected to an input of the digital pre-distortion module, and the crest factor reduction module is also provided onto the single die.

Example 4

The transceiver of any one of the above Examples, can optionally include: a digital up converter module for up converting a first sample rate of a first signal of the first transmit path; wherein the digital up converter module is also provided onto the single die.

Example 5

The transceiver of any one of the above Examples, can optionally include: a digital down converter module for down converting a second sample rate of a second signal of the first receive path; wherein the digital down converter module is also provided onto the single die.

Example 6

The transceiver of any one of the above Examples, can optionally include: an envelope tracking module for adjusting the power supply voltage applied to the power amplifier; wherein the envelope tracking module is connected to an input to the digital pre-distortion module and the envelope tracking module is also provided onto the single die.

Example 7

The transceiver of any one of the above Examples, can optionally include: a transmit component cancellation module for filtering out one or more components of the transmit signal in the first receive path; a second observation receive path for observing the output of the power amplifier and providing a second feedback signal to the transmit component cancellation module; wherein the transmit component cancellation module and at least a part of the first observation receive path are also provided onto the single die.

Example 8

The transceiver of Example 7, can optionally include the at least the part of the second observation receive path being provided onto the single die comprising a mixer and a local oscillator for matching the second observation receive path with the first receive path.

Example 9

The transceiver of Example 7 or 8, can optionally include the one or more components of the transmit signal comprising one or more distortion components that is leaked from the first transmit path onto the first receive path.

Example 10

The transceiver of Example 7 or 8, can optionally include: the transceiver being a full duplex transceiver; and the one or more components of the transmit signal comprising one or more transmit signal components received on the first receive path.

Example 11

The transceiver of any one of the above Examples, can optionally include: a digital control module for controlling a part of the transceiver; a third observation receive path for observing the output of the power amplifier and providing a third feedback signal to the digital control module; wherein the digital control module and at least a part of the third observation receive path are also provided onto the single die, and the at least the part of the third observation receive path being provided onto the single die comprises a mixer and a local oscillator for matching the third observation receive path with the first transmit path or the first receive path.

Example 11.1

The transceiver of Example 11, can optionally include the digital control module being configured to receive a first user-provided parameter that usable for controlling the part of the transceiver.

Example 12

The transceiver of any one of the above Examples, can optionally include: a gain regulation module for adjusting a gain index for any one or more observation receive paths; wherein the gain regulation module is also provided onto the single die.

Example 13

The transceiver of any one of the above Examples, can optionally include: a closed-loop gain control module for controlling the gain of the first transmit path; a fourth observation receive path for observing the output of the power amplifier and providing a fourth feedback signal to the closed-loop gain control module; wherein the closed-loop gain control module and at least a part of the fourth observation receive path are also provided onto the single die.

Example 14

The transceiver of Example 13, can optionally include the closed-loop gain control module is further configured for estimating the gain of the first transmit path based on signal power measurements of an output of the digital pre-distortion module and the fourth feedback signal.

Example 15

The transceiver of Example 13 or 14, can optionally include the closed-loop gain control module being configured to receive a second user-provided parameter that specifies a desired gain of the first transmit path and control the gain of the first transmit path based on the second user-provided parameter.

Example 16

The transceiver of any one of Examples 13-15, can optionally include the closed-loop gain control module being configured to update the gain of the first transmit path in response to one or more changes in the transceiver affecting the gain of the first transmit path.

Example 17

The transceiver of any one of the above Examples, further comprising: a voltage standing wave ratio monitoring module for measuring voltage standing wave ratio; a fifth observation receive path (and optionally a further observation receive path) for observing a forward traveling wave at the output of the power amplifier and providing a fifth feedback signal for the forward traveling wave to the voltage standing wave ratio monitoring module and for observing a reverse traveling wave at the output of the power amplifier and providing a sixth feedback signal for the reverse traveling wave to the voltage standing wave ratio monitoring module; wherein the voltage standing wave ratio monitoring module and at least a part of the fifth observation receive path are also provided onto the single die.

Example 18

The transceiver of Example 17, wherein the voltage standing wave ratio monitoring module is configured to receive a third user-provided parameter that specifies the number of voltage standing wave ratio measurements to be made.

Example 19

The transceiver of any one of the above Examples, further comprising: a power amplifier bias control module for monitoring and controlling the power amplifier; wherein the power amplifier bias control module is also provided onto the single die.

Example 20

The transceiver of Example 19, can optionally include the power amplifier bias control module being configured to receive one or more temperature sensor measurements from a temperature sensor of the power amplifier.

Example 21

The transceiver of Example 20, can optionally include the power amplifier bias control module comprising one or more analog-to-digital converters for converting the one or more temperature sensor measurements to one or more digital temperature sensor measurement values.

Example 22

The transceiver of any one of Examples 19-21, can optionally include the power amplifier bias control module further comprising a look up table and/or mapping function for mapping digital temperature sensor measurement values to bias voltage values.

Example 23

The transceiver of any one of Examples 19-22, can optionally include the power amplifier bias control module further comprising a digital to analog converter for converting one or more bias voltage values to analog bias voltage values.

Example 24

The transceiver of any one of Examples 19-23, can optionally include the power amplifier bias control module being configured to output one or more analog bias voltage values to the power amplifier.

Example 25

The transceiver of Example 22, can optionally include the look up table and/or mapping function being configurable by a user through a user interface of the transceiver.

Example A

The transceiver of any one of the above Examples, can optionally include: a first interface configured to allow a user to configure the transceiver with one or more configuration parameters usable by one or more (digital control) modules of the transceiver.

Example B

The transceiver of any one of the above Examples, can optionally include: a second interface configured to provide one or more hooks allowing a user to sample one or more signals in the transceiver.

Example C

The transceiver of any one of the above Examples, can optionally include: a third interface configured to provide one or more hooks allowing a user to inject one or more signals in the transceiver.

Example D

The transceiver of any one of the above Examples, can optionally include: a fourth interface configured to allow an external device to read from and/or write to a memory of the transceiver, wherein the memory is also provided onto the single die.

Example E

The transceiver of any one of the above Examples, can optionally include: a fifth interface connectable to an electronic display and/or a user input device for providing an interactive user interface that allowing by a user to configure the transceiver with one or more configuration parameters.

Example F

The transceiver of any one of the above Examples, can optionally include the power amplifier for the transmit path being also provided onto the single die.

Example G

The transceiver of any one of the above Examples, can optionally include the transceiver being part of a small cell (femtocell, picocell, microcell).

Selected Examples for Small Cell Base Station and MMIMO Implementations

As previously described herein, the integrated cellular transceiver in accordance with various embodiments of the present disclosure is particularly suitable for use in small cell base stations of cellular wireless telecommunications network or Massive MIMO arrays where each array element may have one of the transceivers as described herein. Following Examples outline features that are particularly advantageous for use in such settings.

Example 1 provides an integrated cellular transceiver for use in a small cell base station of a cellular wireless telecommunications network or in a Massive MIMO array, the transceiver including: a transmit path for transmitting a transmit signal, the transmit path including a sequence of at least a digital to analog converter (232), a filter (234), and a mixer (236); and a digital pre-distortion (DPD) module provided in the transmit path for improving the linearity of the transmit path and/or a power amplifier for the transmit path and configured to provide an input to the sequence of the digital to analog converter, the filter, and the mixer of the transmit path, where the DPD module includes a look-up table (LUT) for performing computations of one or more functions on an input signal received at the DPD module and is configured to apply companding to the input signal to reduce a number of bits used for addressing the LUT (i.e. bits used for presenting input values to the LUT), and the transmit path and the DPD module are provided onto a single die.

Example 2 provides the transceiver according to Example 1, where the DPD module further includes an up-sampling module configured to increase a sampling rate of the input signal received at the DPD module and where further operations performed by the DPD module are carried out on the input signal with the increased sampling rate.

Example 3 provides the transceiver according to Examples 1 or 2, further including: a first observation receive path for observing an output of a power amplifier configured to amplify an output of the transmit path and for providing a first feedback signal to the DPD module, where the first observation receive path is provided onto the single die that the DPD module is provided onto.

Example 4 provides the transceiver according to Example 3, where the transceiver is configured to duty-cycle the first observation receive path.

Example 5 provides the transceiver according to Example 4, where duty-cycling of the first observation receive path includes turning the first observation receive path on for less than 5% of the time.

Example 6 provides the transceiver according to any one of the preceding Examples, where the LUT includes entries re-indexed to enable computation of a square root function on an input to the LUT that includes a magnitude-squared of the input signal.

Example 7 provides the transceiver according to any one of the preceding Examples, where the DPD module is configured to apply coarse quantization to reduce a number of bits used for presenting results of the computations performed using the LUT (i.e. bits used for presenting the output of the LUT).

Example 8 provides the transceiver according to any one of the preceding Examples, further including: an envelope tracking module for receiving the input signal provided to the DPD module and adjusting a power supply voltage applied to a power amplifier configured to amplify an output of the transmit path, where the envelope tracking module is provided onto the single die that the DPD module is provided onto.

Example 9 provides the transceiver according to any one of the preceding Examples, further including: a crest factor reduction module for providing the input signal to the DPD module, the input signal processed by the crest factor reduction module to limit dynamic range of the transmit signal, where the crest factor reduction module is provided onto the single die that the DPD module is provided onto.

Example 10 provides the transceiver according to any one of the preceding Examples, further including: a digital up converter module for increasing a sample rate of the transmit signal (i.e. of the signal communicated over the transmit path), where the digital up converter module is provided onto the single die that the DPD module is provided onto.

Example 11 provides the transceiver according to any one of the preceding Examples, further including: a receive path for receiving a receive signal, the receive path including at least a mixer (246), a filter (244), and an analog to digital converter (242); a digital down converter module for decreasing a sample rate of the receive signal (i.e. of the signal communicated over the receive path), where the receive path and the digital down converter module are provided onto the single die that the DPD module is provided onto.

Example 12 provides the transceiver according to any one of the preceding Examples, further including: a receive path for receiving a receive signal, the receive path including at least a mixer (246), a filter (244), and an analog to digital converter (242); a transmit component cancellation module provided in the receive path for filtering out one or more components of the transmit signal in the receive path, where the receive path and the transmit component cancellation module are provided onto the single die that the DPD module is provided onto.

Example 13 provides the transceiver according to Example 12, further including: a second observation receive path for observing an output of a power amplifier configured to amplify an output of the transmit path and for providing a second feedback signal to the transmit component cancellation module, where the second observation receive path is provided onto the single die that the transmit component cancellation module is provided onto.

Example 14 provides the transceiver according to Examples 12 or 13, further including: a mixer and a local oscillator for matching the second observation receive path with the receive path, where the mixer and the local oscillator are provided onto the single die that the transmit component cancellation module and the second observation receive path are provided onto.

Example 15 provides the transceiver according to any one of Examples 12-14, where the one or more components of the transmit signal that are filtered out in the receive path include one or more distortion components that leaked from the transmit path to the receive path.

Example 16 provides the transceiver according to any one of Examples 12-15, where the transceiver is a full duplex transceiver and where the one or more components of the transmit signal that are filtered out in the receive path include one or more transmit signal components received on the receive path.

Example 17 provides the transceiver according to any one of the preceding Examples, further including: a closed-loop gain control module configured to control a gain of the transmit path; and a third observation receive path for observing an output of a power amplifier configured to amplify an output of the transmit path and for providing a third feedback signal to the closed-loop gain control module, where the closed-loop gain control module and at least a part of the third observation receive path are provided onto the single die that the DPD module is provided onto.

Example 18 provides the transceiver according to Example 17, where the closed-loop gain control module is further configured to estimate the gain of the transmit path based on signal power measurements of an output of the DPD module and the third feedback signal.

Example 19 provides the transceiver according to Examples 17 or 18, where the closed-loop gain control module is further configured to receive a user-defined parameter that specifies a desired gain of the transmit path and to control the gain of the transmit path based on the user-defined parameter.

Example 20 provides the transceiver according to any one of Examples 17-19, where the closed-loop gain control module is further configured to update the gain of the transmit path in response to one or more changes in the transceiver affecting the gain of the transmit path.

What is claimed is:
1. An apparatus comprising:
a transmit path for transmitting a transmit signal; and
a digital pre-distortion (DPD) module configured to provide an input to the transmit path,
wherein:
the DPD module comprises a look-up table (LUT) for performing computations of one or more functions on an input signal received at the DPD module and is configured to apply companding to the input signal to reduce a number of bits used for addressing the LUT, and the transmit path and the DPD module are provided on a single die.

2. The apparatus according to claim 1, wherein the apparatus is a small cell base station.

3. The apparatus according to claim 1, wherein the apparatus is a Massive Multiple Input Multiple Output (MIMO) array.

4. The apparatus according to claim 1, wherein the apparatus is a cellular transceiver.

5. The apparatus according to claim 1, wherein the DPD module is provided in the transmit path for improving the linearity of the transmit path and/or a power amplifier for the transmit path.

6. The apparatus according to claim 1, wherein the DPD module further comprises an up-sampling module configured to increase a sampling rate of the input signal received at the DPD module and wherein further operations performed by the DPD module are carried out on the input signal with the increased sampling rate.

7. The apparatus according to claim 1, further comprising:
a first observation receive path for observing an output of a power amplifier configured to amplify an output of the transmit path and for providing a first feedback signal to the DPD module,
wherein the first observation receive path is provided on the single die.

8. The apparatus according to claim 7, wherein the apparatus is configured to duty-cycle the first observation receive path.

9. The apparatus according to claim 8, wherein duty-cycling of the first observation receive path comprises turning the first observation receive path on for less than 5% of the time.

10. The apparatus according to claim 1, wherein the LUT comprises entries re-indexed to enable computation of a square root function.

11. The apparatus according to claim 1, wherein the DPD module is configured to apply coarse quantization to reduce a number of bits used for presenting results of the computations performed using the LUT.

12. The apparatus according to claim 1, further comprising:
an envelope tracking module for receiving the input signal provided to the DPD module and adjusting a power supply voltage applied to a power amplifier configured to amplify an output of the transmit path,
wherein the envelope tracking module is provided on the single die.

13. The apparatus according to claim 1, further comprising:
a crest factor reduction module for providing the input signal to the DPD module, the input signal processed by the crest factor reduction module to limit dynamic range of the transmit signal,
wherein the crest factor reduction module is provided on the single die.

14. The apparatus according to claim 1, further comprising:
a digital up converter module for increasing a sample rate of the transmit signal,
wherein the digital up converter module is provided on the single die.

15. The apparatus according to claim 1, further comprising:
a receive path for receiving a receive signal;
a digital down converter module for decreasing a sample rate of the receive signal,
wherein the receive path and the digital down converter module are provided on the single die.

16. The apparatus according to claim 1, further comprising:
a receive path for receiving a receive signal;
a transmit component cancellation module provided in the receive path for filtering out one or more components of the transmit signal in the receive path,
wherein the receive path and the transmit component cancellation module are provided on the single die.

17. The apparatus according to claim 16, further comprising:
an observation receive path for observing an output of a power amplifier configured to amplify an output of the transmit path and for providing a second feedback signal to the transmit component cancellation module,
wherein the observation receive path is provided on the single die.

18. The apparatus according to claim 17, further comprising:
a mixer and a local oscillator for matching the observation receive path with the receive path,
wherein the mixer and the local oscillator are provided on the single die.

19. The apparatus according to claim 16, wherein the one or more components of the transmit signal comprise one or more distortion components that leaked from the transmit path to the receive path.

20. The apparatus according to claim 16, wherein the apparatus is a full duplex transceiver and wherein the one or more components of the transmit signal comprise one or more transmit signal components received on the receive path.

21. The apparatus according to claim 1, further comprising:
a closed-loop gain control module configured to control a gain of the transmit path; and
an observation receive path for observing an output of a power amplifier configured to amplify an output of the transmit path and for providing a third feedback signal to the closed-loop gain control module,
wherein the closed-loop gain control module and at least a part of the observation receive path are provided on the single die.

22. The apparatus according to claim 21, wherein the closed-loop gain control module is further configured to estimate the gain of the transmit path based on signal power measurements of an output of the DPD module and the third feedback signal.

23. The apparatus according to claim 21, wherein the closed-loop gain control module is further configured to receive a parameter that specifies a desired gain of the transmit path and to control the gain of the transmit path based on the parameter.

24. The apparatus according to claim 21, wherein the closed-loop gain control module is further configured to update the gain of the transmit path in response to one or more changes in the apparatus affecting the gain of the transmit path.

* * * * *